US011128105B2

(12) United States Patent
Takakura et al.

(10) Patent No.: US 11,128,105 B2
(45) Date of Patent: Sep. 21, 2021

(54) SEMICONDUCTOR LASER DEVICE

(71) Applicant: SHARP KABUSHIKI KAISHA, Sakai (JP)

(72) Inventors: Teruyoshi Takakura, Sakai (JP); Yoshimi Tanimoto, Sakai (JP); Yoshihiko Tani, Sakai (JP); Yuhzoh Tsuda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 114 days.

(21) Appl. No.: 16/749,352

(22) Filed: Jan. 22, 2020

(65) Prior Publication Data
US 2020/0251885 A1 Aug. 6, 2020

Related U.S. Application Data

(60) Provisional application No. 62/801,505, filed on Feb. 5, 2019.

(51) Int. Cl.
| H01S 5/00 | (2006.01) |
| H01S 5/22 | (2006.01) |
| H01S 5/042 | (2006.01) |
| H01S 5/10 | (2021.01) |
| H01S 5/062 | (2006.01) |
| H01S 5/343 | (2006.01) |

(52) U.S. Cl.
CPC ........ *H01S 5/2202* (2013.01); *H01S 5/04256* (2019.08); *H01S 5/0624* (2013.01); *H01S 5/1003* (2013.01); *H01S 5/22* (2013.01); *H01S 5/2201* (2013.01); *H01S 5/34333* (2013.01); *H01S 2301/18* (2013.01)

(58) Field of Classification Search
CPC ...... H01S 5/04256; H01S 5/22; H01S 5/2202; H01S 5/0624; H01S 5/1003; H01S 5/2201; H01S 5/34333; H01S 2301/18
See application file for complete search history.

(56) References Cited

U.S. PATENT DOCUMENTS

| 7,512,167 | B2* | 3/2009 | Izu | H01S 5/4025 372/36 |
| 7,746,910 | B2* | 6/2010 | Kawanaka | H01S 5/34326 372/45.013 |
| 2008/0298411 | A1* | 12/2008 | Hata | H01S 5/028 372/45.01 |
| 2010/0189146 | A1* | 7/2010 | Bessho | H01S 5/4043 372/43.01 |
| 2010/0329296 | A1* | 12/2010 | Hata | H01S 5/405 372/50.12 |

FOREIGN PATENT DOCUMENTS

| JP | 2002-324947 A | 11/2002 |
| JP | 2008-311292 A | 12/2008 |
| JP | 2011-181604 A | 9/2011 |

\* cited by examiner

*Primary Examiner* — Kinam Park
(74) *Attorney, Agent, or Firm* — ScienBiziP, P.C.

(57) ABSTRACT

In a semiconductor laser device, a semiconductor layer includes a first groove formed on both sides of a ridge, a pair of second recesses facing each other and between which the ridge is interposed on a side of a light emitting surface, and a pair of third grooves in parallel to the first groove from the light emitting surface and interposing the ridge therebetween.

7 Claims, 25 Drawing Sheets

SEMICONDUCTOR LASER DEVICE

BACKGROUND

1. Field

The present disclosure relates to a semiconductor laser device.

2. Description of the Related Art

In recent years, a semiconductor laser device is compact and lightweight, has high reliability, and generates laser with high output, such that the semiconductor laser device has been used in various fields. Such a semiconductor laser device in which, in a semiconductor layer, portions defining an optical waveguide face each other are disposed with a ridge interposed therebetween and a pair of grooves having a depth laterally traversing an active layer are provided, has been known (for example, see Japanese Unexamined Patent Application Publication No. 2002-324947).

However, a shape of a far field pattern (FFP) is elliptical in the semiconductor laser device described in Japanese Unexamined Patent Application Publication No. 2002-324947, which is problematic. This is because a ratio (aspect ratio) between a radiation angle of the FFP in a vertical transverse mode and a radiation angle of the FFP in a horizontal transverse mode is large.

It is desired to provide a semiconductor laser device capable of obtaining an FFP having a more circular shape.

SUMMARY

According to an embodiment of the present disclosure, there is provided a semiconductor laser device formed by stacking a semiconductor layer, a dielectric film, and an electrode layer in this order. The semiconductor layer is formed by stacking an n-type clad layer and a p-type clad layer in this order and includes a ridge formed on the p-type clad layer and extending from one end to an other end in a direction laterally traversing the semiconductor layer when viewed in a plan view, two first recesses, each of which is formed on both sides of the ridge along the laterally traversing direction, two groove-shaped second recesses having a depth reaching the n-type clad layer from the p-type clad layer and extending, on the same line, from each end in a direction longitudinally traversing the semiconductor layer to positions where the ridge is interposed between the two groove-shaped second recesses, when viewed in a plan view, and two groove-shaped third recesses having a depth reaching the n-type clad layer from the p-type clad layer, extending from the one end in the direction laterally traversing the semiconductor layer toward the second recesses in the laterally traversing direction when viewed in a plan view, and disposed at positions where the ridge is interposed between the two groove-shaped third recesses in the longitudinally traversing direction. The dielectric film covers at least a surface of the semiconductor layer other than the ridge. The electrode layer overlaps the ridge and overlaps the dielectric film on an other end side from the second recess in the laterally traversing direction when viewed in a plan view.

DESCRIPTION OF THE EMBODIMENTS

Embodiment 1

Schematic Configuration

A semiconductor laser device according to an embodiment of the present disclosure can be configured by a known technique using a known material for a semiconductor laser device in a range in which the effect of the present embodiment can be obtained, except for a third groove described later. Hereinafter, the semiconductor laser device according to the present embodiment will be described as a nitride semiconductor laser device.

Figure 1:
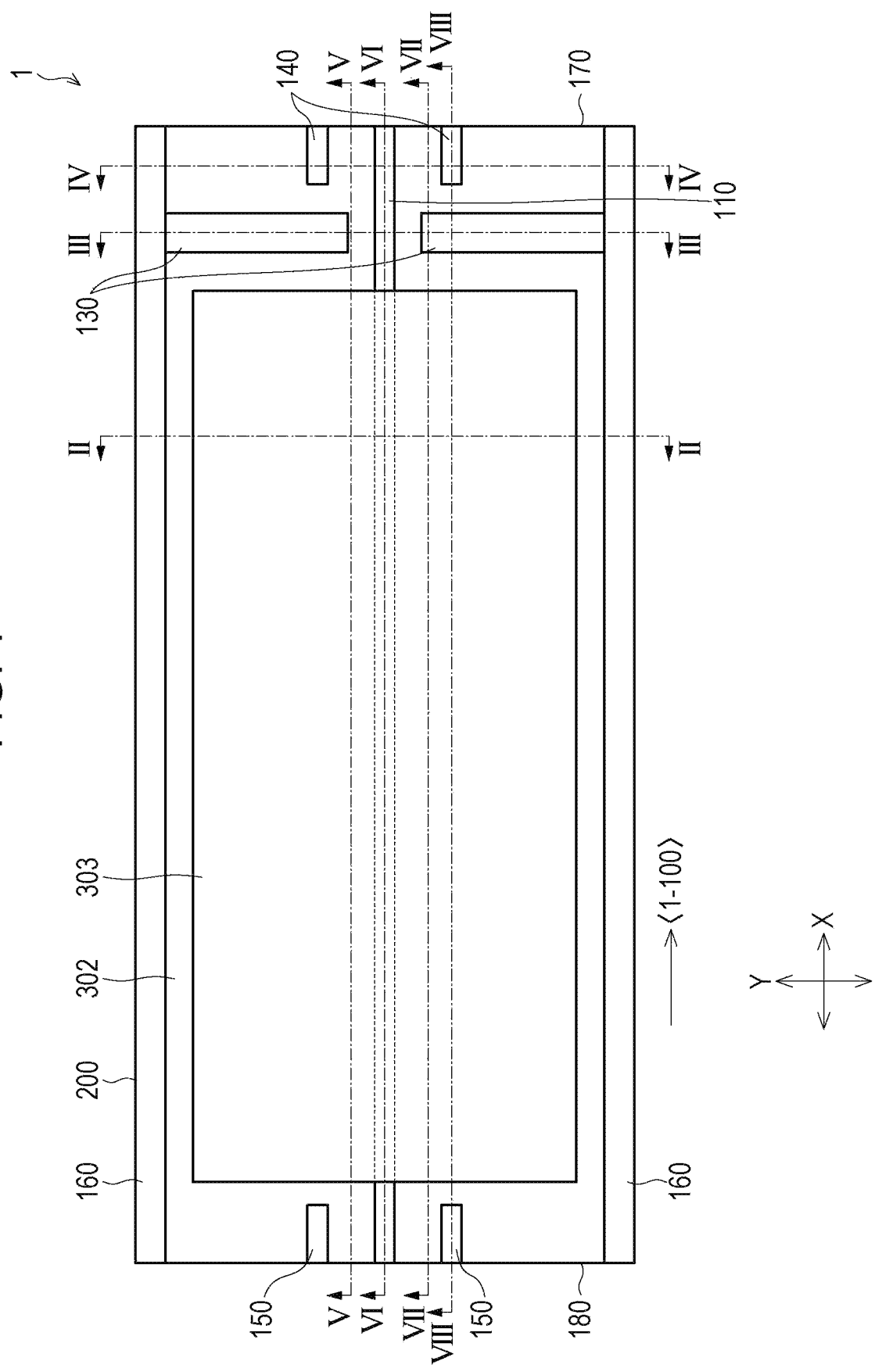
FIG. 1 is a plan view schematically illustrating a configuration of a semiconductor laser device according to Embodiment 1 of the present disclosure.
Figure 2:
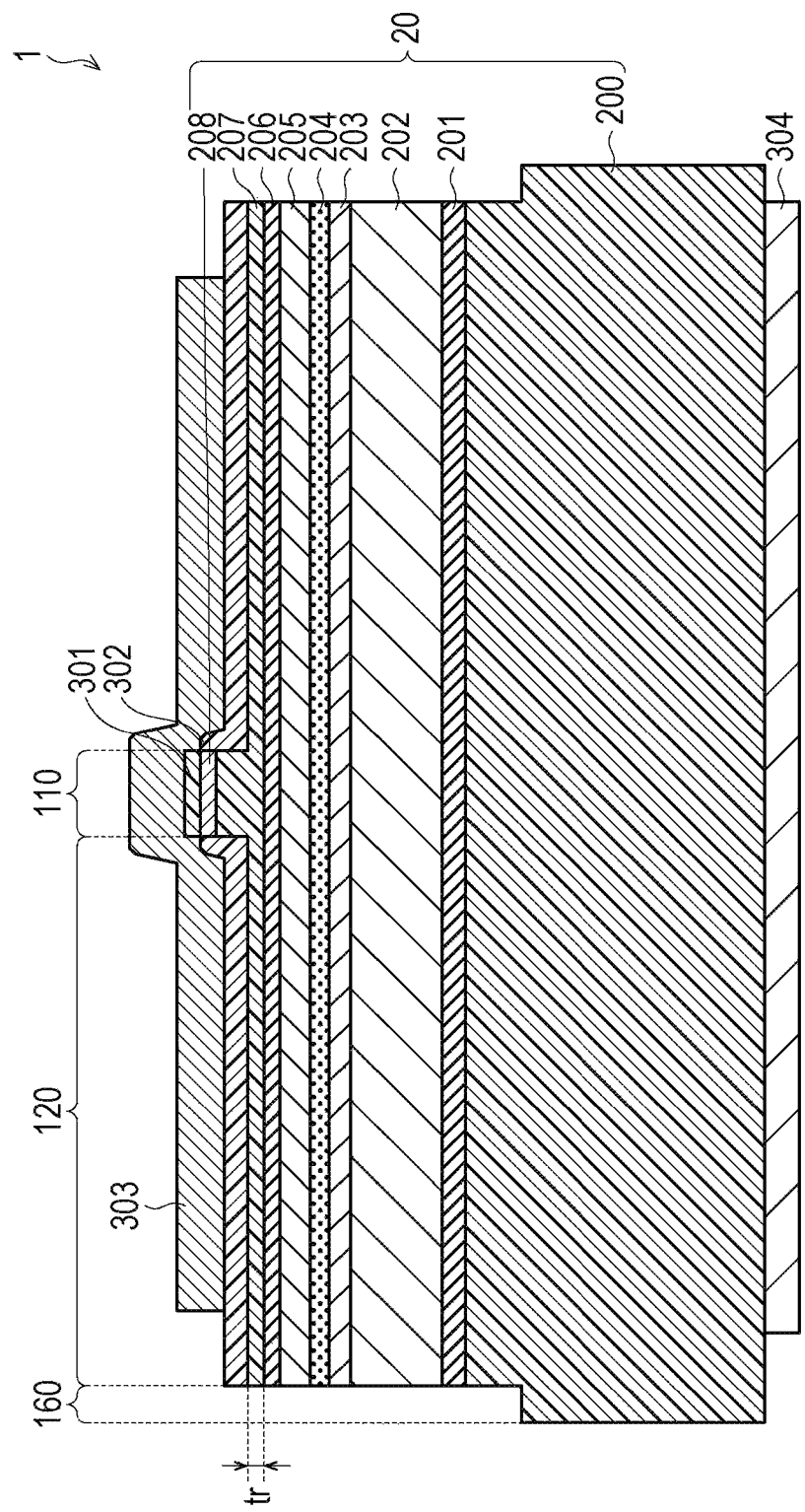
FIG. 2 is a view schematically illustrating a cross section of a semiconductor laser according to Embodiment 1 of the present disclosure, which is taken along the line II-II in FIG. 1.
Figure 3:
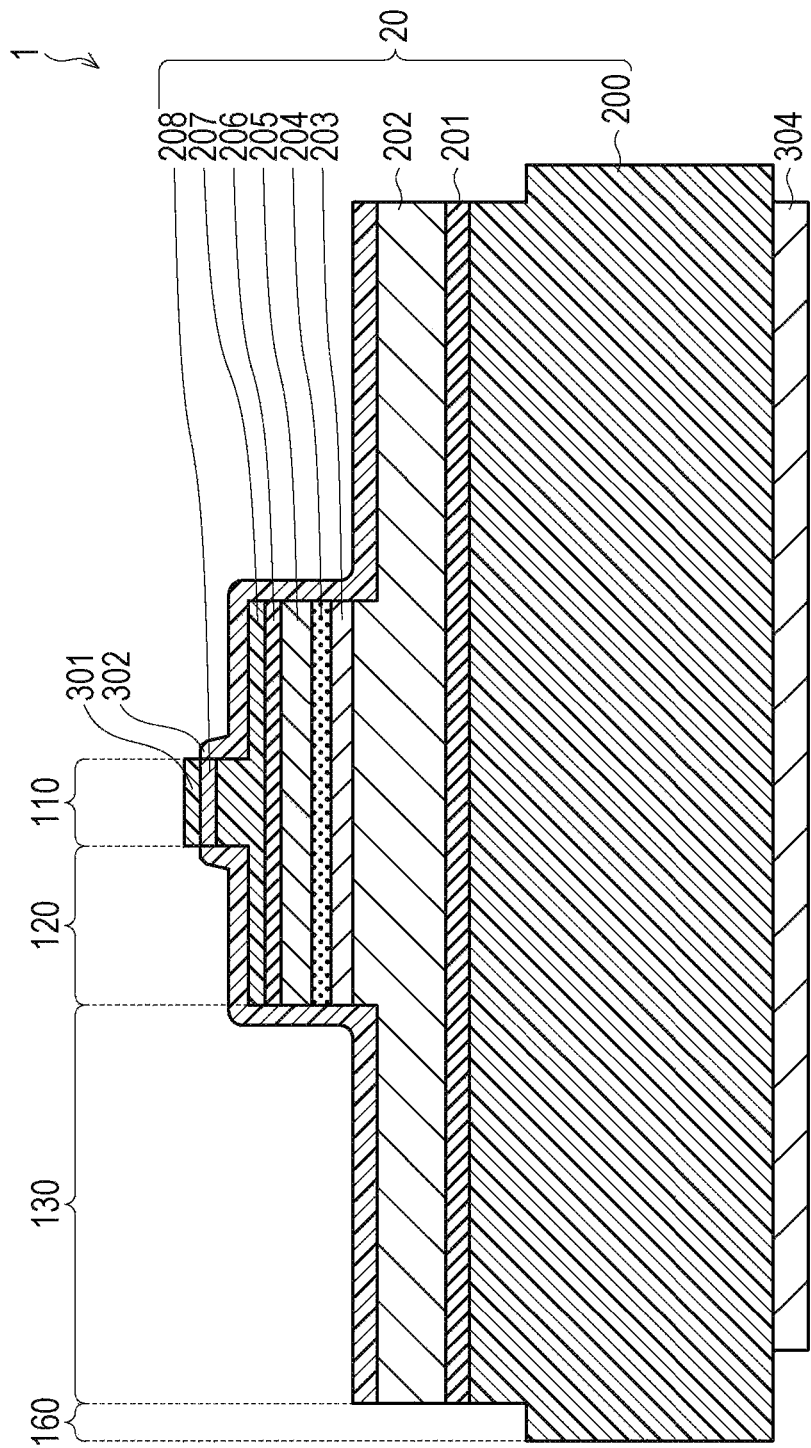
FIG. 3 is a view schematically illustrating a cross section of a semiconductor laser according to Embodiment 1 of the present disclosure, which is taken along the line III-III in FIG. 1.
Figure 4:
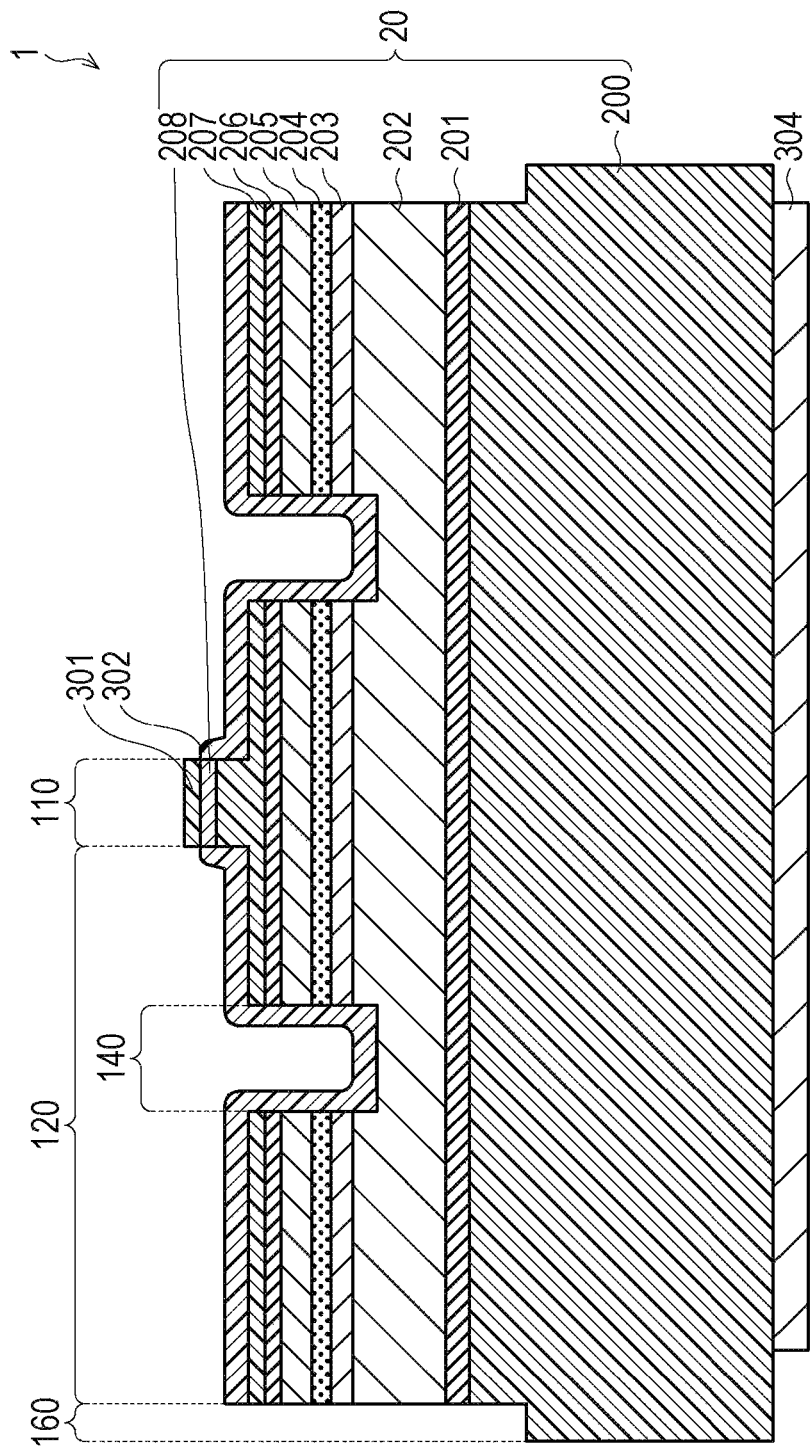
FIG. 4 is a view schematically illustrating a cross section of a semiconductor laser according to Embodiment 1 of the present disclosure, which is taken along the line IV-IV in FIG. 1.
Figure 5:
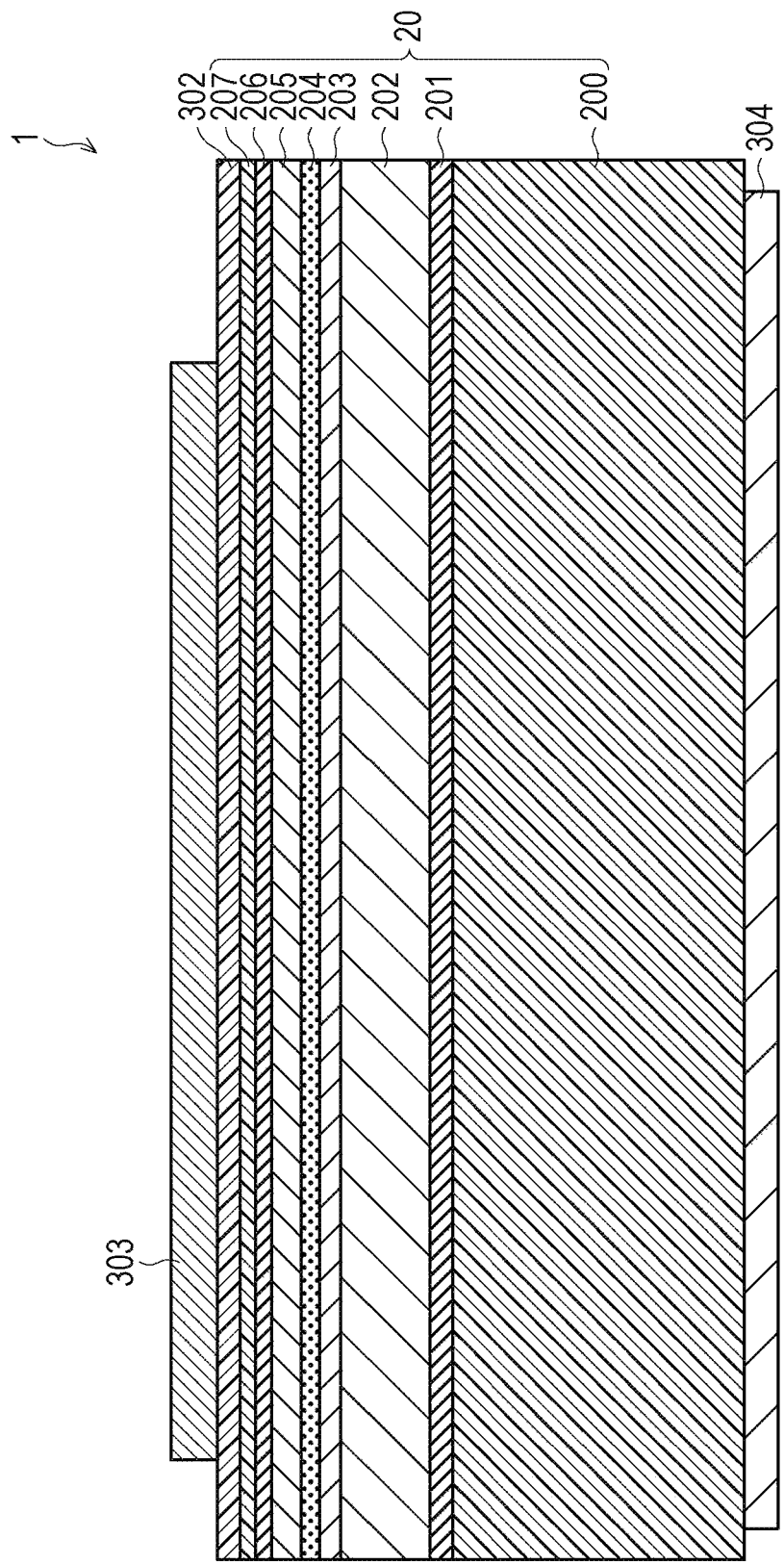
FIG. 5 is a view schematically illustrating a cross section of a semiconductor laser according to Embodiment 1 of the present disclosure, which is taken along the line V-V in FIG. 1.
Figure 6:
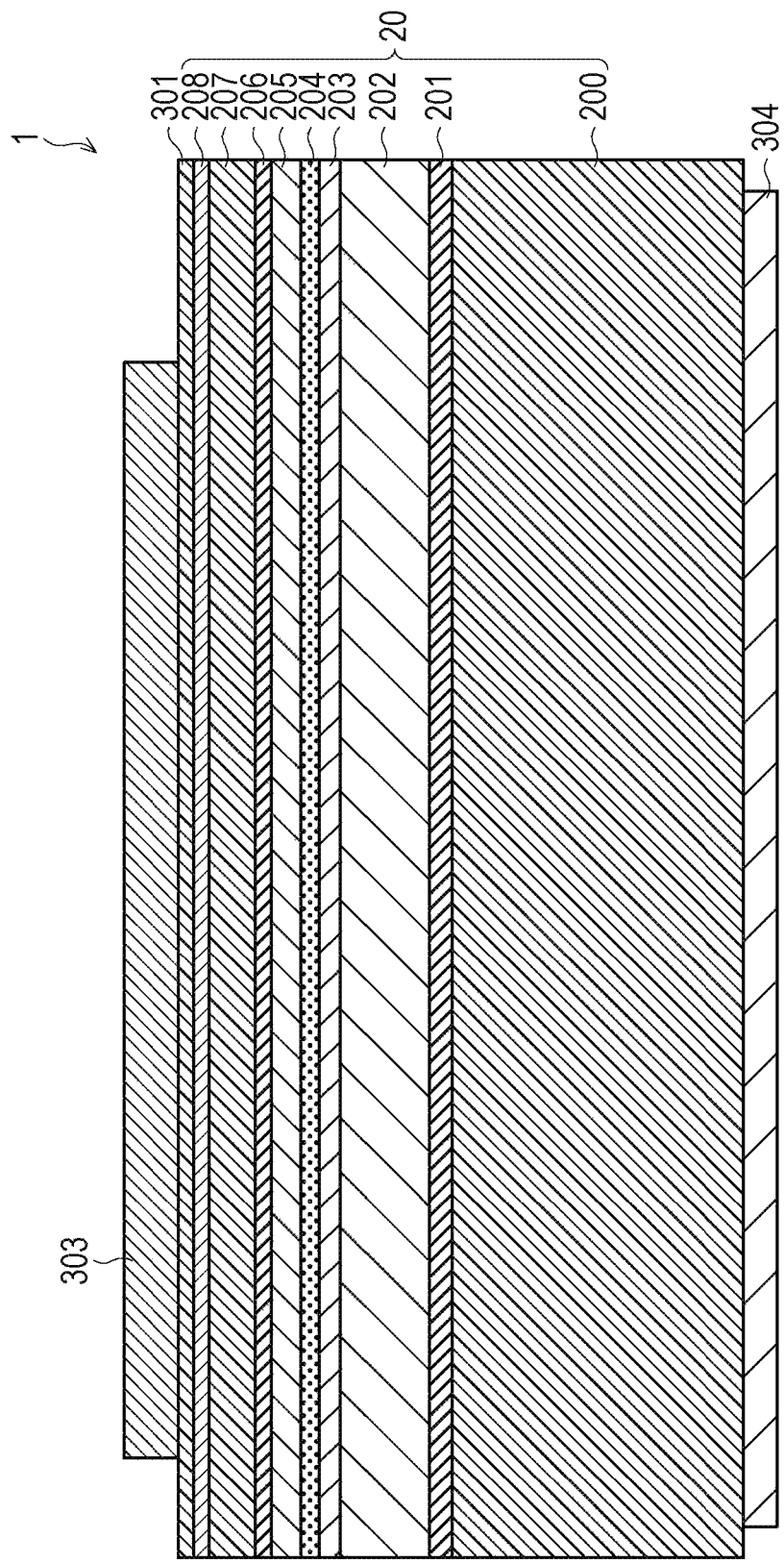
FIG. 6 is a view schematically illustrating a cross section of a semiconductor laser according to Embodiment 1 of the present disclosure, which is taken along the line VI-VI in FIG. 1.
Figure 7:
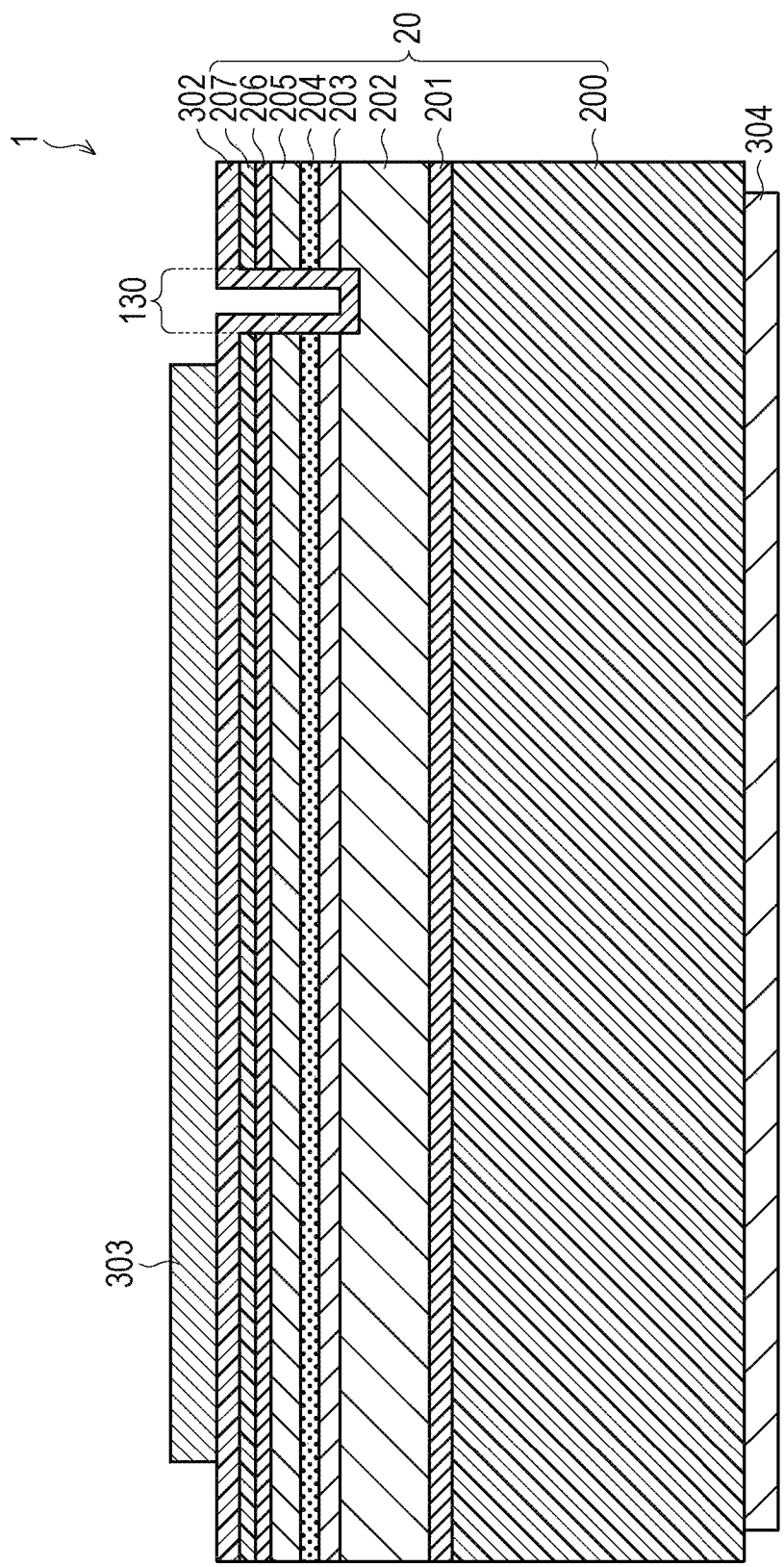
FIG. 7 is a view schematically illustrating a cross section of a semiconductor laser according to Embodiment 1 of the present disclosure, which is taken along the line VII-VII in FIG. 1.
Figure 8:
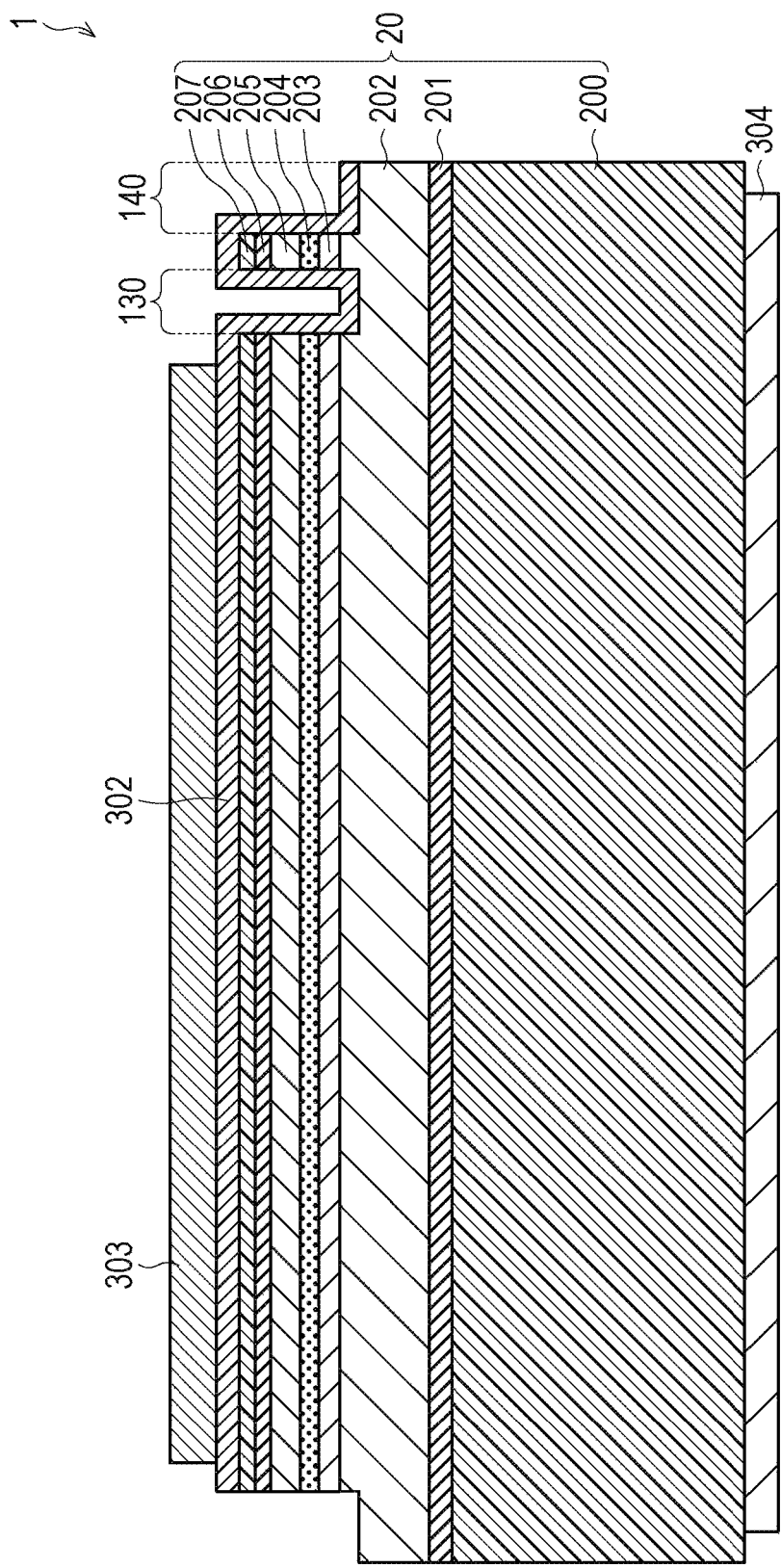
FIG. 8 is a view schematically illustrating a cross section of a semiconductor laser according to Embodiment 1 of the present disclosure, which is taken along the line VIII-VIII in FIG. 1.

FIGS. 1 to 8 illustrate the semiconductor laser device according to the present embodiment. FIG. 1 is a plan view schematically illustrating a configuration of the semiconductor laser device according to Embodiment 1 of the present disclosure. FIGS. 2 to 8 are views schematically illustrating cross sections of the semiconductor laser, which are taken along the lines II-II, III-III, IV-IV, V-V, VI-VI, VII-VII, and VIII-VIII in FIG. 1, respectively.

A semiconductor laser device 1 is mainly formed by stacking an n-electrode 304, a semiconductor layer 20, a dielectric film 302, and an electrode layer in this order. The electrode layer is formed of an ohmic electrode 301 and a p-electrode 303.

A planar shape of the semiconductor laser device 1 is rectangular. A longitudinal direction of the planar shape is set as an X direction and a lateral direction thereof is set as a Y direction. The X direction corresponds to a direction laterally traversing the semiconductor laser device 1 and the Y direction corresponds to a direction longitudinally traversing the semiconductor laser device 1.

One end surface of the semiconductor laser device 1 in the X direction is a light emitting surface 170 and the other end surface thereof is a reflective surface 180. The light emitting surface 170 is formed of an anti-reflection (AR) coating layer which is formed on one end surface of the semiconductor laser device 1. The reflective surface 180 is formed of a high-reflection (HR) coating layer which is formed on the other end surface of the semiconductor laser device 1.

n-Electrode

The n-electrode 304 is formed of a known electrode material. In addition, the n-electrode 304 is formed of a plurality of electrode materials. An electrode material that is in ohmic contact with an n-type semiconductor is used for a material of a layer on a side of the n-type semiconductor among a plurality of layers, and examples thereof include titanium, hafnium, and zirconium. Examples of the material of layers other than the above-described layer among the plurality of layers include gold and aluminum. The n-electrode 304 is formed by a vapor deposition method or a sputtering method. Examples of the n-electrode 304 include a titanium layer having a thickness of 20 nm and a gold layer having a thickness of 300 nm. The thickness of each of the layers in the n-electrode 304 is not limited to this.

Nitride Semiconductor Substrate

A nitride semiconductor substrate 200 may be a substrate formed of a nitride semiconductor and can be replaced with an $Al_aGa_bIn_cN$ ($0 \leq a \leq 1$, $0 \leq b \leq 1$, $0 \leq c \leq 1$, $a+b+c=1$) substrate. In addition, the nitride semiconductor substrate 200 may be doped with Si, O, Cl, S, C, Ge, Zn, Cd, Mg, or Be. In a case where an n-type nitride semiconductor substrate is used for the nitride semiconductor substrate 200, among the doping materials, Si, O, Ge, and Cl is particularly desirable. Examples of a major surface of the nitride semiconductor substrate 200 include a C-plane {0001}, an A-plane {11-20}, an M-plane {1-100}, an R-plane {1-102}, and a {20-21} plane, and the C-plane {0001} is most desirable. In addition, if an off angle of the nitride semiconductor substrate 200 is 0.2° or more and 2° or less, an excellent surface morphology of the semiconductor layer laminated on the nitride semiconductor substrate can be obtained.

Semiconductor Layer

Layer Configuration

The semiconductor layer 20 may function as a semiconductor layer of the semiconductor laser device and have a known layer configuration as the semiconductor layer. For example, in the semiconductor layer 20, an n-type underlying layer 201, an n-type clad layer 202, a first light guide layer 203, an active layer 204, a second light guide layer 205, a p-type carrier block layer 206, a p-type clad layer 207, and a p-type contact layer 208 are stacked on the nitride semiconductor substrate 200 in this order. As such, the semiconductor layer 20 is formed by stacking the n-type clad layer 202 and the p-type clad layer 207 in this order.

A layer that is known to have such a function in the semiconductor laser device can be applied to the n-type underlying layer 201. Examples of the composition of the n-type underlying layer 201 include $Al_aGa_{1-a}N$ doped with n-type impurities (desirably Si) and Si-doped $In_bGa_{1-b}N$.

The n-type clad layer 202 and the p-type clad layer 207 are formed of a crystal material having an effect of confining light generated from the active layer 204 to an optical waveguide region. For the n-type clad layer 202 and the p-type clad layer 207, a crystal material having a refractive index smaller than that of the active layer 204, the first light guide layer 203, and the second light guide layer 205 may be used. For example, if the laser is in a wavelength band from blue-violet to green, examples of the n-type clad layer 202 and the p-type clad layer 207 include $Al_aGa_{1-a}N$ doped with n-type impurities (desirably Si) and $Al_aGa_{1-a}N$ doped with p-type impurities (desirably Mg).

The first light guide layer 203 is a layer for reducing propagation loss in the optical waveguide. A layer that is known to have such a function in the semiconductor laser device can be applied to the first light guide layer 203. Examples of the composition of the first light guide layer 203 include $In_bGa_{1-b}N$ doped or undoped with n-type impurities (desirably Si). The first light guide layer 203 may have a single layer structure or a laminated structure obtained by stacking a plurality of layers having the above-described composition or different compositions having a similar function.

The active layer 204 is formed of a crystal material. Here, the "active layer" is a collective term for indicating a well layer or a layer formed of a well layer and a barrier layer. For example, a single-quantum-well structure active layer is formed of only one well layer or a laminated structure of a barrier layer, a well layer, and a barrier layer. In addition, a multiple-quantum-well structure active layer is formed of a plurality of well layers and a plurality of barrier layers, and for example, a multiple structure having a lamination units of the well layer and the barrier layer being repeatedly stacked. A crystal forming the active layer 204 can be determined in accordance with optical characteristics such as a desired wavelength a well layer has. In addition, the crystal forming the active layer 204 can be appropriately determined in accordance with the use of the semiconductor laser device. Examples of the crystal material forming the active layer 204 include undoped $In_bGa_{1-b}N$ or $In_bGa_{1-b}N$ doped with n-type impurities at a part of the layer.

The second light guide layer 205 is a layer for reducing propagation loss in the optical waveguide in the same manner as the first light guide layer 203. In the second light guide layer 205, $In_bGa_{1-b}N$ doped or undoped with p-type impurities (desirably Mg) is contained. The second light guide layer 205 may be a layer having a single layer structure or a laminated structure obtained by laminating a plurality of layers having the above-described composition or different compositions having a similar function.

The p-type carrier block layer 206 is a layer for suppressing electrons from leaking to the p-type clad layer, and a layer that is known to have an expected function in the semiconductor laser device can be applied to the p-type carrier block layer 206. Examples of the p-type carrier block layer 206 include a layer of a multilayer film which has a nitride semiconductor layer containing $Al_aGa_{1-a}N$ ($0 \le a \le 1$) and a nitride semiconductor layer containing $Al_aGa_{1-a}N$ ($0.03 \le a \le 0.15$).

The configuration of the p-type carrier block layer 206 can be appropriately determined from the viewpoint of exhibiting an expected function. For example, Composition a of Al in the entire p-type carrier block layer 206 is desirably 0.10 to 0.25 from the viewpoint of blocking the leakage of electrons to the p-type clad layer. In addition, the total film thickness of the p-type carrier block layer 206 is desirably 0.005 to 0.02 ppm from the viewpoint of reducing a forward voltage (Vf).

The multilayer film has a laminated structure of the nitride semiconductor layers having different compositions from each other. From the viewpoint of realizing the excellent crystallinity, desired examples of the multilayer film include a multilayer film formed by laminating an $Al_aGa_{1-a}N$ layer and a GaN layer. More specifically, a multilayer film formed by laminating undoped $Al_aGa_{1-a}N$ and GaN doped with p-type impurities (for example, Mg) is desired. The p-type impurities may be doped into $Al_aGa_{1-a}N$. A doped amount of the p-type impurities can be appropriately determined from the viewpoint of realizing an expected crystallinity and bulk resistance in each layer of the multilayer film, and for example, the doped amount thereof is $1 \times 10^{17}/cm^3$ to $1 \times 10^{19}/cm^3$. The film thickness in each layer of the multilayer film suppresses influence on a crystal structure of Al and generation of cracks, and for example, the thickness thereof is preferably 10 angstroms or more and 200 angstroms or less, more preferably 70 angstroms or less, and still more preferably 40 angstroms or less, from the viewpoint of enhancing the crystallinity.

The p-type contact layer 208 is a layer being in ohmic contact with the ohmic electrode. A layer that is known to have such a function in the semiconductor laser device can be applied to the p-type contact layer 208. Examples of the p-type contact layer 208 include GaN and $Al_aGa_{1-a}N$ which are doped with Mg. A doping concentration is, for example, desirably $1 \times 10^{19}/cm^3$ to $2 \times 10^{20}/cm^3$. In addition it is more desirable that the concentration of the p-type impurities is increased toward a direction of the ohmic electrode 301. Thereby, a contact resistance due to the formation of a p-electrode is reduced.

Recess and Ridge

The semiconductor layer 20 has a first recess (hereinafter, referred to as "first groove") 120, a ridge 110, a second recess (hereinafter, referred to as "second groove") 130, a third recess (hereinafter, referred to as "third groove") 140, and a division guide groove 160. These grooves and the ridge can be formed by a known photolithography technique and a known etching technique.

The ridge 110 is formed between the first grooves 120 and 120, extends from one end to the other end of the semiconductor layer 20 in a direction laterally traversing the semiconductor layer 20 when viewed in a plan view, and is a portion protruding from the first groove 120. The ridge 110 is formed on the p-type clad layer 207.

The first grooves 120 and 120 are two recesses formed on both sides of the ridge 110 along the Y direction in the semiconductor layer 20 when viewed in a plan view. In the present embodiment, the first grooves 120 and 120 are recesses formed at the same depth from the ridge 110 to both edges of the semiconductor layer 20 in the Y direction. For example, the first groove 120 has a depth reaching the p-type clad layer 207 from the p-type contact layer 208. As described above, the first groove 120 is formed on the p-type clad layer 207 and does not traverse the p-type clad layer 207 in a depth direction.

The second recesses 130 and 130 are two groove-shaped recesses which extend from each end in the Y direction longitudinally traversing the semiconductor layer 20 to a position where the ridge 110 is interposed therebetween, when viewed in a plan view. In addition, the second groove 130 is disposed between the light emitting surface 170 and the p-electrode 303. In addition, the second grooves 130 and 130 are disposed on the same line extending in the Y direction. In addition, when each end of the second grooves 130 and 130 at a side of the ridge 110 in the Y direction is set as a tip end, the tip end of the second groove 130 is located to be spaced apart from the ridge 110 in the Y direction. As an example, the tip ends of the second grooves 130 are located to be symmetric with respect to a center axis of the ridge 110. More specifically, as illustrated in FIG. 1, the second grooves 130 and 130 are disposed at positions symmetric with respect to the ridge 110 in the Y direction.

The second groove 130 has a depth reaching the n-type clad layer 202 from the p-type clad layer 207. As described above, the second groove 130 has a depth reaching the n-type clad layer 202 from the p-type clad layer 207 and traverses the active layer 204 in a laminating direction.

The third recesses 140 and 140 are two groove-shaped recesses which extend from one end of the semiconductor layer 20 in the X direction laterally traversing the semiconductor layer 20 toward the second groove 130 in the X direction, when viewed in a plan view. The third grooves 140 and 140 are disposed at positions where the ridge 110 is interposed therebetween in the Y direction laterally traversing the semiconductor layer 20 when viewed in a plan view. The third groove 140 has a depth reaching the n-type clad layer 202 from the p-type clad layer 207 in the same manner as the second groove 130. That is, the third groove 140 traverses from the p-type contact layer 208 to the active layer 204 in the laminating direction and has a depth reaches the n-type clad layer 202.

Shapes of the first groove 120, the second groove 130, and the third groove 140 can be appropriately determined in a range in which an expected function is exhibited. For example, planar shapes of the grooves and the ridge 110 are usually rectangular, but may be other shapes. In addition, a shape of cross sections of the grooves and the ridge 110 each of which is traversed in the longitudinal direction may be rectangular, forward mesa (for example, trapezoid having a bottom side longer than a top side), and inverted mesa (for example, trapezoid having a bottom side shorter than a top side).

The semiconductor layer 20 further has a fourth groove 150 formed on the other end portion of the semiconductor layer in the X direction. The fourth groove 150 is disposed at a position symmetric to the third groove 140 in the X direction, and has the same planar shape, cross-sectional shape, and depth as that of the third groove 140. Although the details will be described below, the fourth groove 150 is formed on a wafer before division as the third groove 140 and is formed on a side of the reflective surface 180 of the semiconductor laser device 1 by being cleaved to traverse the third groove 140. In addition, the semiconductor laser device 1 may be manufactured so as not to have the fourth groove 150 on the side of the reflective surface 180, but in order to form a flat cleaving plane, it is desirable that the fourth groove 150 is formed on the side of the reflective surface 180.

The division guide groove 160 is a groove formed on an end in the Y direction of the semiconductor laser device 1 along the X direction of the semiconductor laser device 1 which is parallel to the ridge 110. The division guide groove 160 is manufactured on a wafer described below and a division position of a bar in the X direction in order to improve yield in division. Although the details will be described below, as the semiconductor laser device 1 is manufactured, when a bar 3 is divided as an example in FIG. 14, the bar 3 is divided at a position of the division guide groove 160, thereby manufacturing the semiconductor laser device 1 with high yield.

For example, the nitride semiconductor used in the present disclosure does not have cleavability in the X direction (that is, <1-100> direction), so that the nitride semiconductor used in the present disclosure is hard to be split in the X direction. Therefore, the division guide groove 160 is formed on the wafer or the bar and put scratches at a position coinciding with the division guide groove 160 from a back surface side, thereby improving yield in division.

Dielectric Film

The dielectric film 302 has an insulating property. The dielectric film 302 can be formed by a known method such as a vapor deposition method and using a known material capable of being used for an insulating layer in the semiconductor laser device 1. Examples of the material of the dielectric film 302 include aluminum oxide, silicon oxide, zirconia, silicon nitride, aluminum nitride, gallium nitride, silicon oxynitride, and aluminum oxynitride.

The dielectric film 302 is formed to cover the semiconductor layer 20 from above except for the ridge 110. More specifically, the dielectric film 302 covers a surface of the semiconductor layer 20 except for at least a top of the ridge 110 and is formed to insulate at least a current being injected into a p-electrode layer. In addition, a side surface of the ridge 110 is covered with the dielectric film 302 and is thus insulated.

The dielectric film 302 is formed on the side surface of the ridge 110 and the surface of the semiconductor layer 20 except for at least the top of the ridge 110 and may provide insulation between the p-electrode 303 and the semiconductor layer 20. In addition, the dielectric film 302 is integrally formed on the cleaving plane and a bottom surface of the second groove 130 and the third groove 140, which is desirable from the viewpoint as follows. When the semiconductor laser device 1 is bonded with junction down on a sub-mount by a solder material, it is possible to suppress current leakage from the grooves even when the solder material flows into the second groove 130 and the third groove 140.

A thickness of the dielectric film 302 can be appropriately determined from the viewpoint of exhibiting an expected insulating property, but the thickness thereof is desirably 0.05 to 0.3 μm because heat radiation becomes low when the thickness is too large. For example, the dielectric film 302 may be formed of silicon oxide having a thickness of 0.1 μm.

p-Electrode Layer

The electrode layer is formed of the ohmic electrode 301 and the p-electrode 303 as described above.

The ohmic electrode 301 overlaps the ridge 110. The ohmic electrode 301 corresponds to a first electrode layer. The ohmic electrode 301 can be formed of a material that forms ohmic contact with the semiconductor. Examples of the material include palladium and nickel. For example, the ohmic electrode 301 may be formed of a palladium layer having a thickness of 0.05 μm.

The p-electrode 303 is disposed on the other end side from the second groove 130 in the X direction when viewed in a plan view. The p-electrode 303 overlaps the dielectric film 302 and the ohmic electrode 301 at a position in the planar direction. However, the p-electrode 303 is disposed at a portion up to one end side from the fourth groove 150 in the X direction, and the fourth groove 150, although being covered with the dielectric film 302, is not covered with the p-electrode 303. The p-electrode 303 corresponds to a second electrode layer. For a position in which the p-electrode 303 is formed, a distance from the second groove 130 may be, for example, 2.5 μm.

The p-electrode 303 can be formed using a material known as an electrode material of the semiconductor laser device. For example, the p-electrode 303 may be formed of a titanium layer having a thickness of 0.03 μm or a gold layer having a thickness of 1 μm.

As described above, the electrode layer overlaps the ridge 110 and, when viewed in a plan view, overlaps the dielectric film 302 which is disposed on the other end side from the second groove 130 in the X direction. In a case where side surface portions and bottom surface portions of the second groove 130, the third groove 140, and the fourth groove 150 are reliably covered with the dielectric film 302, the p-electrode 303 may be partially or entirely formed on the grooves.

Disposition and Dimension

Figure 9:
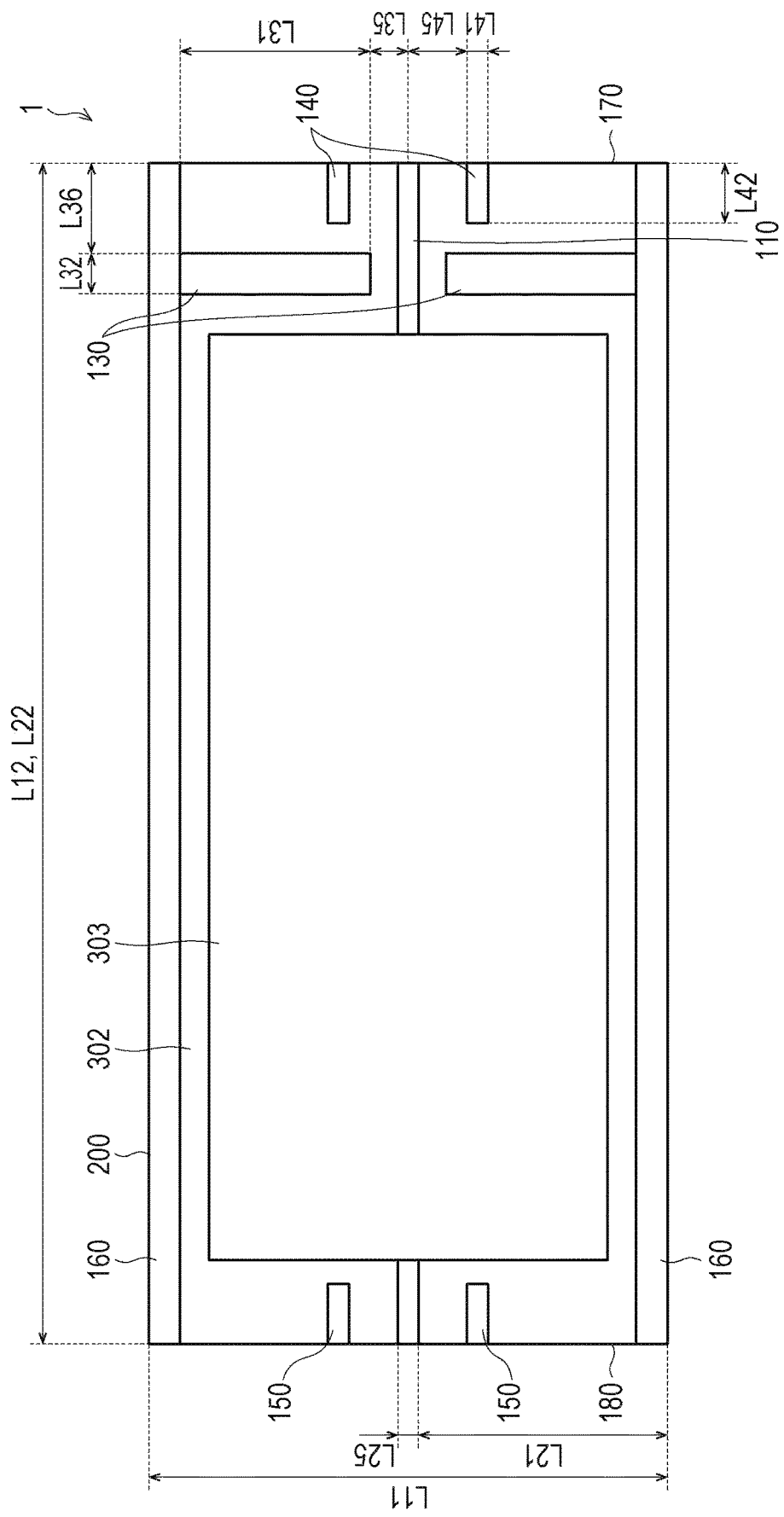
FIG. 9 is a view for explaining dimensions of the semiconductor laser according to Embodiment 1 of the present disclosure.

Hereinafter, a three-dimensional structure such as a groove in the semiconductor laser device 1 will be further described. FIG. 9 is a view for explaining dimensions of the semiconductor laser according to Embodiment 1 of the present disclosure. Hereinafter, dimensions and the like in each component of the semiconductor laser device 1 will be described assuming that a resonator has a length of 800 μm and a chip width of 200 μm.

The length of the resonator is a length in the longitudinal direction of a rectangle which is a planar shape of the semiconductor laser device 1, that is, a length L12 in the X direction. The chip width of the resonator is a length in the lateral direction of a rectangle, that is, a length L11 in the Y direction. The dimensions of each portion can be appropriately determined in accordance with expected physical properties of a laser output by the semiconductor laser device 1.

In terms of the dimensions described above, the thickness of each layer in the semiconductor layer 20 may be, for example, as follows. For example, in the semiconductor layer 20, the n-type underlying layer 201 made of GaN doped with Si having a thickness of 0.2 μm, the n-type clad layer 202 made of $Al_{0.06}Ga_{0.94}N$ doped with Si having a thickness of 1 μm, the first light guide layer 203 made of undoped GaN having a thickness of 0.2 μm, the active layer 204 having a thickness of 0.025 μm, the second light guide layer 205 made of undoped $In_{0.04}Ga_{0.96}N$ having a thickness of 0.2 μm, the p-type carrier block layer 206 made of $Al_{0.15}Ga_{0.85}N$ undoped with Mg having a thickness of 0.01 μm, the p-type clad layer 207 made of $Al_{0.04}Ga_{0.96}N$ doped with Mg having a thickness of 0.5 μm, and the p-type contact layer 208 made of GaN doped with Mg having a thickness of 0.1 μm, are formed on the nitride semiconductor substrate 200 with the C-plane {0001} as a major plane. The active layer 204 is composed of two well layers made of undoped $In_{0.15}Ga_{0.85}N$ each having a thickness of 0.003 μm and three barrier layers made of undoped GaN each having a thickness of 0.006 μm. Each well layer is interposed between the barrier layers.

Ridge

The ridge 110 has a length L22 in the X direction and a length L25 in the Y direction.

The ridge 110 is disposed between the both ends of the semiconductor layer 20 along the X direction. Therefore, the length L22 of the ridge 110 in the X direction is, for example, 800 μm as in the length of the semiconductor laser device 1 in the X direction.

The length L25 of the ridge 110 in the Y direction can be appropriately determined from the viewpoint of narrowing a length (width) of the optical waveguide in the Y direction into a desired range. From the viewpoint as such, the length L25 can be appropriately determined from a range of, for example, 1.0 to 2.5 μm, and may be, for example, 1.5 μm.

First Groove (First Recess)

The first groove 120 has the length L22 in the X direction, a length L21 in the Y direction, and a length (depth) in the laminating direction.

The first groove 120 is formed on both sides of the ridge 110 in the X direction of the semiconductor layer 20. Therefore, the length L22 of the first groove 120 in the X direction is, for example, 800 μm as in the length of the ridge 110, that is, the length of the semiconductor laser device 1 in the X direction.

The length L21 of the first groove 120 in the Y direction reaches an end of the semiconductor laser device 1 in the Y direction.

A depth of the first groove 120 is a distance from the p-type contact layer 208 to a bottom of the first groove 120. The depth of the first groove 120 can be appropriately determined in a range in which the p-type clad layer 207 is continuous in the Y direction and the p-type contact layer 208 is sufficiently divided. The depth of the first groove 120 is, for example, 0.5 μm.

A thickness tr of the p-type clad layer 207 at the bottom of the first groove 120 is a distance from a boundary between the p-type carrier block layer 206 and the p-type clad layer 207 to the bottom of the first groove 120. The thickness tr can be appropriately determined in a range in which the p-type clad layer 207 is sufficiently continuous in the Y direction. From the viewpoint as such, the thickness tr can be appropriately determined from a range of, for example, 0.05 μm or more and 0.3 μm or less, and may be, for example, 0.1 μm.

Second Groove

A length L35 from the second groove 130 to the center of the ridge 110 is a distance from the tip end of the second groove 130 to the center axis of the ridge 110 in the Y direction. In addition, the length L35 can be appropriately determined from a range of 2 μm or more and 8 μm or less, and may be, for example, 5 μm, from the viewpoint of obtaining an effect in widening a radiation angle $\theta_h$ of an FFP in a horizontal transverse mode and viewpoint of reducing damage caused in the vicinity of the optical waveguide in a manufacturing process.

In a case where a groove is formed in the vicinity of the optical waveguide, such as the second groove 130, it may damage the optical waveguide and affect reliability of degradation in life or characteristics of the semiconductor laser device. Generally, as the groove is close to the optical waveguide, the damage to the optical waveguide due to the formation of the groove is increased. For example, when the length L35 is less than 2 μm, the optical waveguide suffers a substantially large damage that runs from the groove toward a center direction of the ridge 110. Therefore, the deterioration of the semiconductor laser device 1 is likely to progress. On the other hand, when the length L35 is longer than 8 μm, the optical waveguide is not sufficiently narrowed in the Y direction, and the widening of the radiation angle $\theta_h$ of the FFP in the horizontal transverse mode may not be fully effective.

A length L32 of the second groove 130 in the X direction can be appropriately determined from a range of 1 μm or more and 15 μm or less from the viewpoint of widening the radiation angle $\theta_h$ of the FFP in the horizontal transverse mode and obtaining excellent device characteristics.

When the length L32 exceeds 15 μm, since a range in which the optical waveguide is damaged increases in the X direction, device characteristics may deteriorate such as an increase in an Iop (operating current). In addition, when the length L32 is less than 1 μm, it is difficult to make the length L32 uniform (in the Y direction). The length L32 is desirably 1 μm or more from the viewpoint of making the L32 uniform and suppressing stay light (light leaked out) from the optical waveguide from propagating through the semiconductor layer 20.

A length L31 of the second groove 130 in the Y direction may be at least 15 μm or more from the viewpoint of suppressing stay light (light leaked out) from the optical waveguide from propagating through the semiconductor layer 20, and can be appropriately determined as long as the length L31 is a length to the side surface of the semiconductor laser device in the Y direction, and may be, for example, a length reaching the division guide groove 160.

It is desirable that the second groove 130 is manufactured up to a position where continuity of the semiconductor layer 20 in the Y direction stops. From the viewpoint as such, the second groove 130 is manufactured so as to reach the side surface of the division guide groove 160 of the semiconductor laser device 1.

A length L 36 from the second groove 130 to the light emitting surface 170 is a distance from one end of the second groove 130 in the X direction to one end surface of the semiconductor layer 20. The length L36 can be appropriately determined from a range of 3 µm or more and 30 µm or less from the viewpoint of improving yield in a step of cutting out the semiconductor laser device from the substrate by the cleavage and the viewpoint of suppressing stay light from leaking out of the optical waveguide. For example, the length L36 may be 5 µm.

A depth of the second groove 130 may be a depth sufficient for the second groove 130 to traverse the active layer 204 in the laminating direction and is more desired if the second groove 130 reaches the n-type clad layer 202. The depth of the second groove 130 is a distance from the p-type contact layer 208 to the bottom of the second groove 130 in the laminating direction. It is desirable that the second groove 130 has such a sufficient depth from the viewpoint of forming the FFP which is close to Gaussian distribution.

Third Groove

A length L42 of the third groove 140 in the X direction is a length from one end surface of the semiconductor layer 20 in the X direction to the other end of the third groove 140. The length L42 can be appropriately determined from the viewpoint of bringing a shape of laser light in the Y direction, which is wave-guided from a portion between the second grooves 130 and 130 to the light emitting surface 170, closer to Gaussian. For example, the length L42 can be appropriately determined from a range of 40% to 100% of the length L36, and according to the viewpoint, the longer the length L42 is desirable. The length L42 may be, for example, 3 µm (60% of the length L36).

The length L42 which is 100% of the length L36 means that the third groove 140 is connected to (integral with) the second groove 130. As described above, the third groove 140 which is connected to the second groove 130 at the other end in the X direction is desirable from the viewpoint of bringing the shape of laser light in the Y direction closer to Gaussian.

If the length L42 is too short, an effect of bringing the FFP closer to a Gaussian shape is not able to be sufficiently obtained. It is desirable that the length L42 is longer than the length L32 in the second groove, that is, the relationship with the length L32 satisfies L42>L32. In addition, in a step of manufacturing the semiconductor laser device 1, the ridge 110 may be broken when the third groove 140 is formed by etching. Therefore, the length L42 can be appropriately determined from a range of 2 µm or more and 15 µm or less, and may be, for example, 5 µm, from the viewpoint of suppressing the propagation of stay light, the viewpoint of reducing the damage of the ridge in manufacturing, the viewpoint of suppressing damage in the optical waveguide region, and the viewpoint of bringing the FFP closer to Gaussian distribution.

A length L41 of the third groove 140 in the Y direction may be 1 µm or more from the viewpoint of manufacturing the third groove 140 while keeping the shape stable, may reach the side surface of the semiconductor laser device in the Y direction, and can be appropriately determined. For example, the length L41 may be 10 µm.

A depth of the third groove 140 may be a depth sufficient for the third groove 140 to traverse the active layer 204 in the laminating direction in the same manner as that of the second groove 130, and is more desirable if the third groove 140 reaches the n-type clad layer 202.

The length L45 from the third groove 140 to the center of the ridge 110 is a distance from the side surface of the third groove 140 on a side of the ridge 110 to the center axis of the ridge 110 in the Y direction. If the length L45 is too long, light containment to the optical waveguide is insufficient in the Y direction. On the other hand, if the length L45 is too short, the optical waveguide is substantially damaged, and the deterioration of the semiconductor laser device 1 is thus likely to progress. Therefore, it is desirable that the length L45 is longer than the length L35 in the second groove 130, that is, the relationship with the length L35 satisfies L45>L35.

Division Guide Groove

A width of the division guide groove 160 may be appropriately determined. For example, the width of the division guide groove may be 10 µm. In addition, the division guide groove 160 has a form for division in a direction having no cleavability. In the present embodiment, other forms for the division instead of the division guide groove 160 may be used.

Manufacturing Method

The semiconductor laser device can be manufactured by using a known method. For example, the semiconductor laser device 1 can be manufactured in accordance with the following steps (1) to (13) by using a known technique such as laminating and etching. A manufacturing method of the semiconductor laser device will be described with reference to FIGS. 10 to 14.

(1) First, the semiconductor layer 20 from the n-type underlying layer 201 to the p-type contact layer 208 is sequentially grown on the nitride semiconductor substrate 200 to manufacture a wafer 2. The wafer 2 is a laminate of the nitride semiconductor substrate 200 and the semiconductor layer 20 on the nitride semiconductor substrate 200, and is a term used in a state until the laminate is cleaved and divided. For example, the semiconductor layer 20 on the nitride semiconductor substrate 200 is grown by using an epitaxial growing method such as a metal organic chemical vapor deposition (MOCVD) method.

(2) The wafer 2 on which the semiconductor layer 20 is manufactured is subjected to heat treatment (annealing) for example, at 850° C., by using a heat treatment apparatus. A p-type semiconductor layer including the p-type carrier block layer 206, the p-type clad layer 207, and the p-type contact layer 208 can make the resistance low by the heat treatment.

(3) A mask is manufactured on the surface of the semiconductor layer 20 of the annealed wafer 2 by using a general photolithography technique. The mask has an opening extending in the X direction and having a width (length in the Y direction) of 1.5 µm at 200 µm intervals, for example, in the Y direction. Palladium is subjected to vapor deposition on the wafer 2 on which mask is formed at a thickness of, for example, 20 nm. Subsequently, the mask is subjected to lift-off. Thus, the ohmic electrode 301 extending in the X direction and having a width of 1.5 µm is manufactured at 200 µm intervals in the Y direction.

The X direction in which the ohmic electrode 301 is extended is a <1-100> direction perpendicular to a {1-100} plane which is a cleavage plane of the nitride semiconductor crystal. In addition, the interval of the ohmic electrode 301 in the Y direction is the length L11 which is a width of the semiconductor laser device and may be designed in accordance with a shape of the manufactured semiconductor laser device. The nitride semiconductor crystal will be described below as an example of a gallium nitride crystal.

Figure 10:
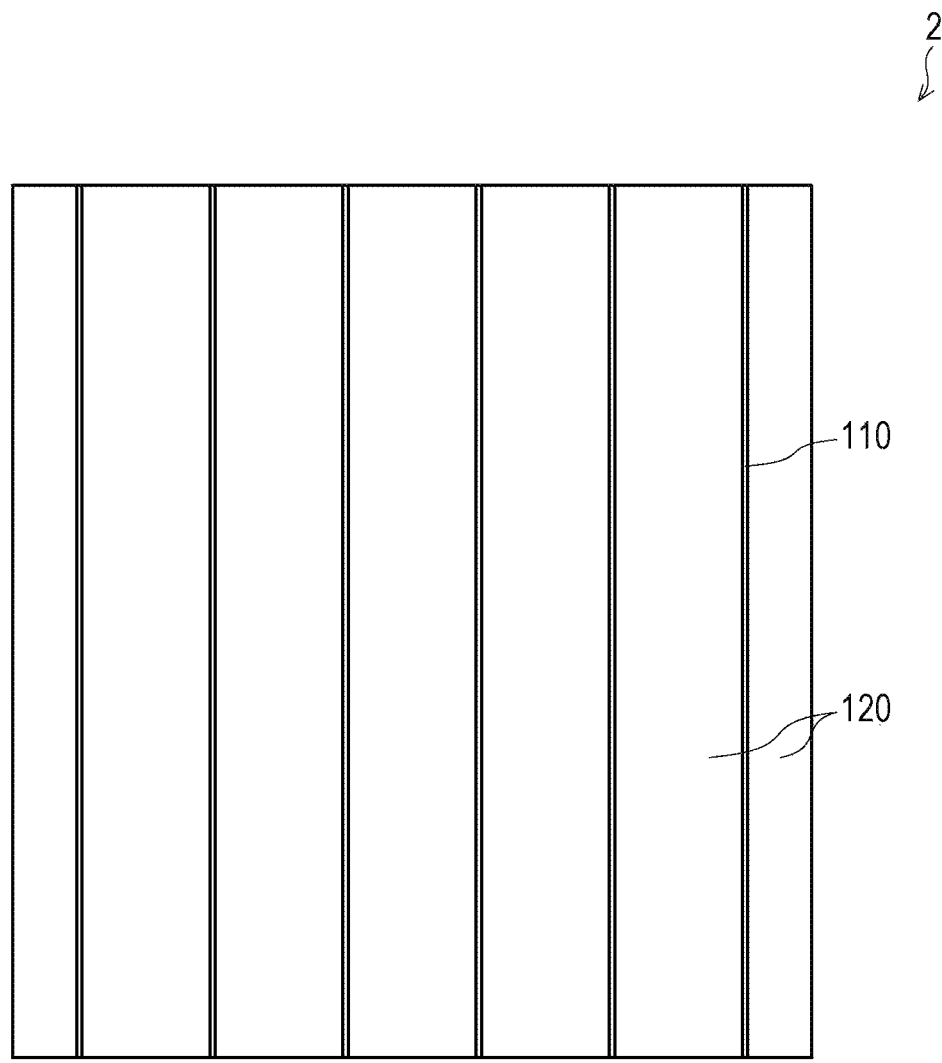
FIG. 10 is a plan view schematically illustrating a wafer in a process of manufacturing the semiconductor laser according to Embodiment 1 of the present disclosure.

(4) Subsequently, the mask covering only the ohmic electrode 301 is manufactured on the wafer 2. For example, the first groove 120 is formed in the p-type contact layer 208 and the p-type clad layer 207 by using a dry etching technique such as inductive coupled plasma (ICP) and reactive ion etching (RIE). Then, the mask is removed. Accordingly, only the ridge 110 has a protruding shape. FIG. 10 is a plan view schematically illustrating the wafer in the process of manufacturing the semiconductor laser according to Embodiment 1 of the present disclosure. FIG. 10 illustrates a state in which etching is performed on the wafer 2 and the protruding ridge 110 and the first groove 120 that are extended in the <1-100> direction periodically are manufactured.

(5) After the first groove 120 is manufactured, the mask having an opening for forming the second groove 130 and the third groove 140 is manufactured on the wafer 2 by using a photolithography technique. The second groove 130 and the third groove 140 are manufactured by etching to a depth laterally traversing the first light guide layer 203 of the semiconductor layer 20, by using the same dry etching technique as the first groove 120. Then, the mask is removed.

(6) The division guide groove 160 is manufactured on the wafer 2 in which the second groove 130 and the third groove 140 are manufactured. For example, by using a photolithography technique and a dry etching technique, the groove having a width of, for example, 10 μm is manufactured at a depth reaching the nitride semiconductor substrate at 200 μm intervals, thereby manufacturing the division guide groove 160.

Figure 11:
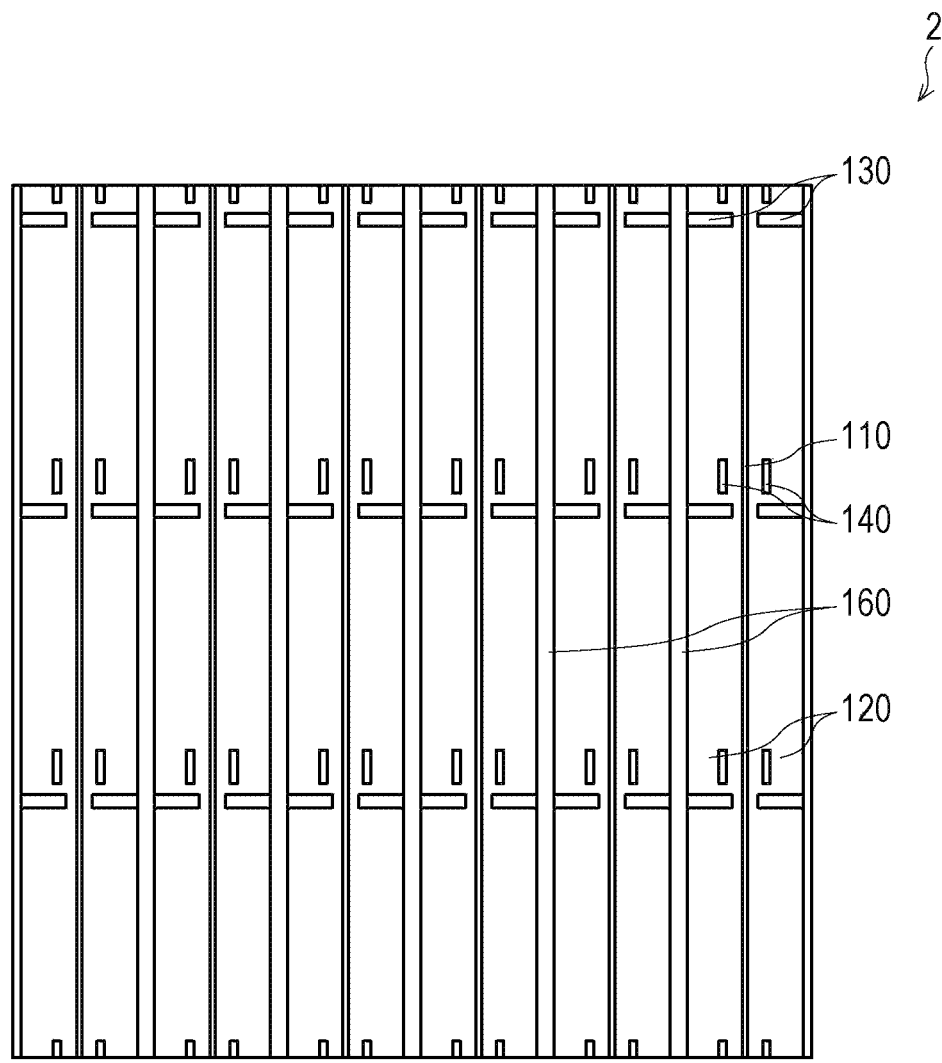
FIG. 11 is a plan view schematically illustrating the wafer in the process of manufacturing the semiconductor laser according to Embodiment 1 of the present disclosure.

FIG. 11 is a plan view schematically illustrating the wafer in the process of manufacturing the semiconductor laser according to Embodiment 1 of the present disclosure. FIG. 11 illustrates a state in which the second groove 130 and the third groove 140 are manufactured by etching on the wafer 2 in which the first groove 120 and the ridge 110 are manufactured. In addition, in FIG. 12, the division guide groove 160 is manufactured. A position in which a bar to be described below is divided when the wafer 2 is divided into individual semiconductor laser devices 1 with high yield corresponds to a position of the division guide groove 160.

(7) The dielectric film 302 is manufactured on the wafer 2 in which the division guide groove 160 is manufactured by using a photolithography technique. The dielectric film 302 is manufactured by using a vapor deposition method, a sputtering method, a CVD method, and the like so that the ohmic electrode 301 on the top of the ridge 110 and the division guide groove 160 are exposed. A thickness of the dielectric film 302 is desirably 0.1 to 0.3 μm, and for example, is 0.1 μm. For example, in the manufacturing of the dielectric film 302, the mask having the opening can be manufactured at a position corresponding to the ridge 110, and the width of the opening is 1.5 μm as an example.

Figure 12:
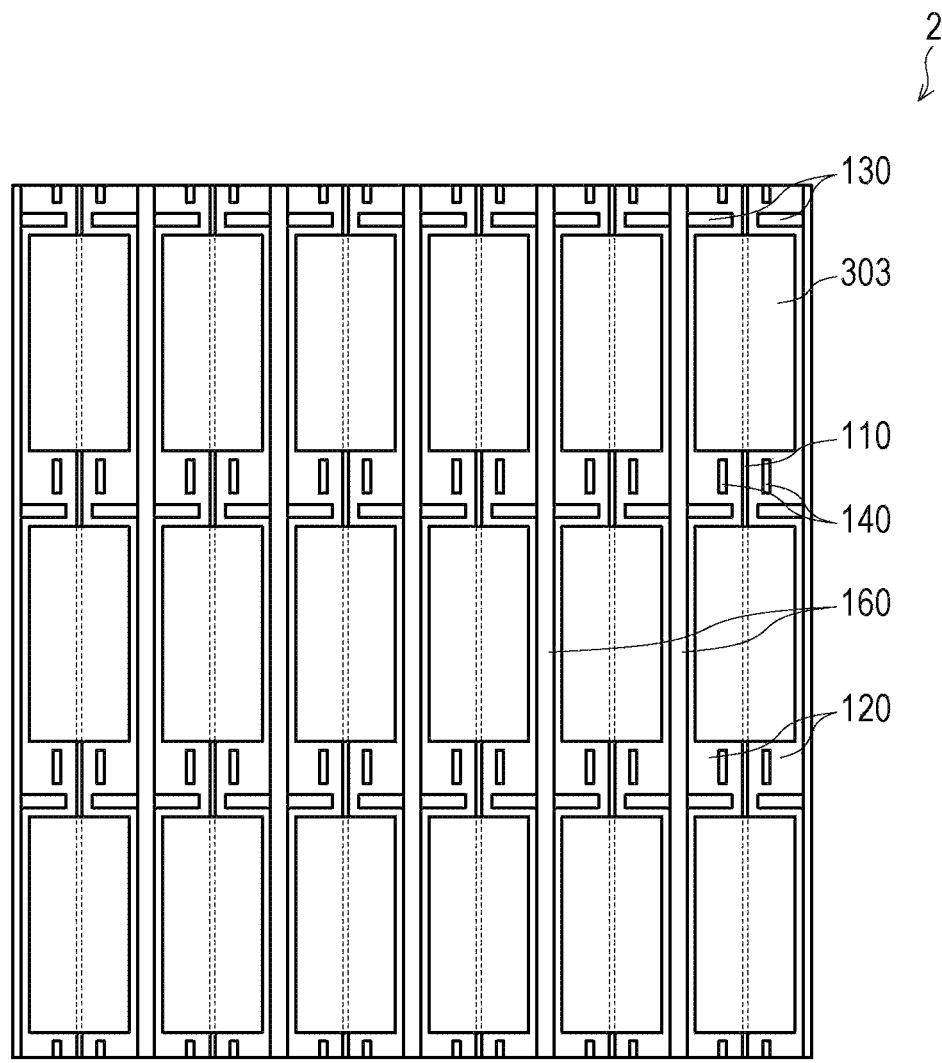
FIG. 12 is a plan view schematically illustrating the wafer in the process of manufacturing the semiconductor laser according to Embodiment 1 of the present disclosure.

(8) Resist materials are applied onto the wafer 2 on which the dielectric film 302 is manufactured and thus the mask is manufactured by using a general photolithography technique. The mask is a p-electrode pattern mask and has an opening located at a position away from the second groove 130 and the third groove 140, and on the ohmic electrode 301 and the dielectric film 302. Next, a titanium layer having a thickness of 15 nm and a gold (Au) layer having a thickness of 400 nm are sequentially manufactured as the p-electrode 303, by a vapor deposition method or a sputtering method. Subsequently, the mask is subjected to lift-off. Thus, the patterned p-electrode 303 is manufactured. FIG. 12 is a plan view schematically illustrating the wafer in the process of manufacturing the semiconductor laser according to Embodiment 1 of the present disclosure. FIG. 12 illustrates the wafer 2 after the step of manufacturing the p-electrode 303 on the ridge 110 and the first groove 120 is performed.

(9) In order to improve yield when the wafer 2 is divided into bars or chips, a back surface (side of the nitride semiconductor substrate) of the wafer 2 is ground and polished to reduce a thickness of the wafer to about 40 to 200 μm.

(10) A titanium layer having a thickness of 20 nm and a gold layer having a thickness of 300 nm are sequentially manufactured on a surface on which the wafer 2 is ground and polished, by a vapor deposition method, a sputtering method, or the like. Thus, the n-electrode 304 is manufactured.

Figure 13:
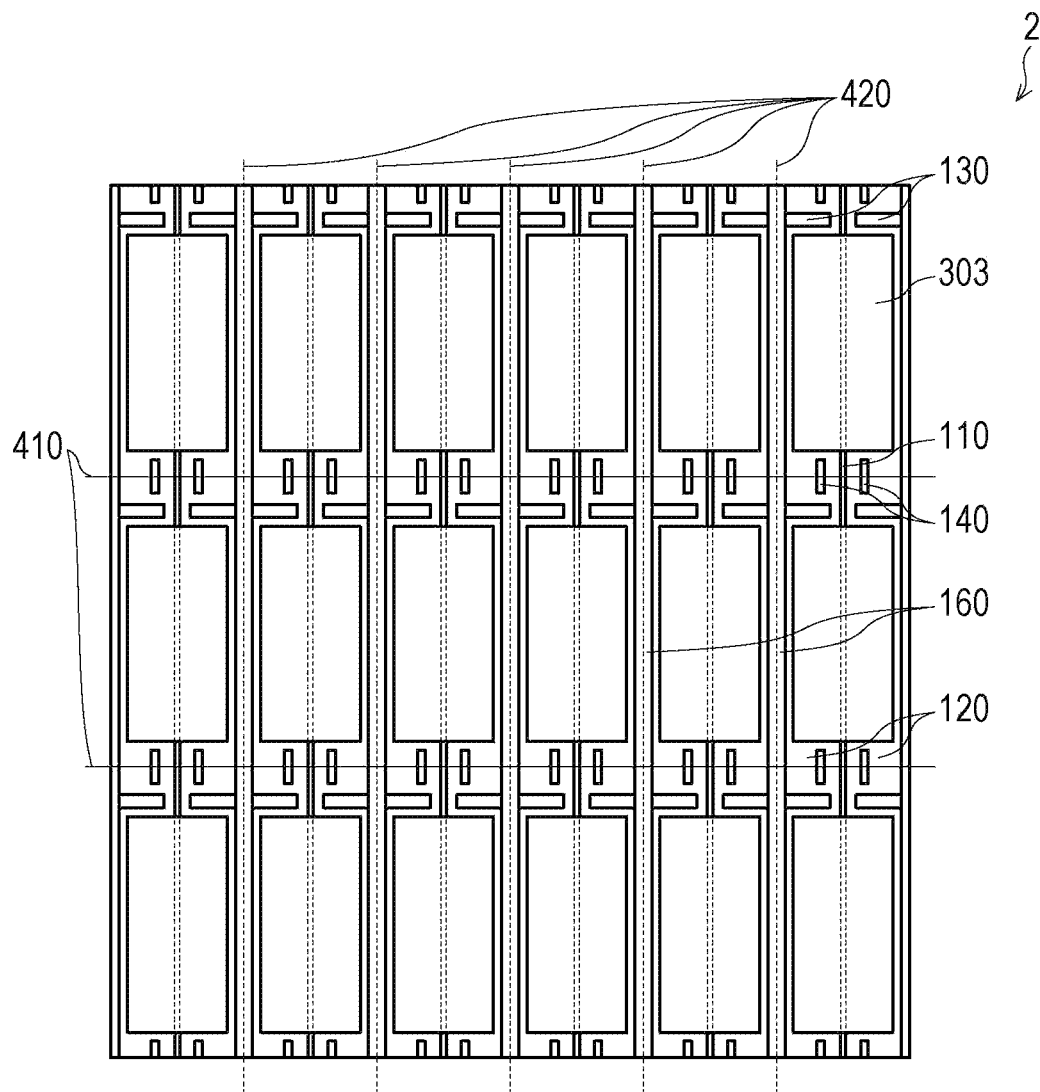
FIG. 13 is a plan view schematically illustrating the wafer in the process of manufacturing the semiconductor laser according to Embodiment 1 of the present disclosure.

(11) FIG. 13 is a plan view schematically illustrating the wafer in the process of manufacturing the semiconductor laser according to Embodiment 1 of the present disclosure. FIG. 13 illustrates the wafer 2 after being formed from the ridge 110 and the first groove 120 to the n-electrode 304. The wafer 2 is cleaved at a position laterally traversing the third groove 140 (cleavage line 410) in a direction perpendicular to the ridge 110. An end surface of the resonator is formed by the cleavage and the resonator having a length of 800 μm is thus manufactured. By the cleavage, the third groove 140 is formed on a side of the light emitting surface 170 of the semiconductor laser device 1 and the fourth groove 150 is formed on a side of the reflective surface 180, respectively. Note that, the length of the resonator is not limited to 800 μm.

Figure 14:
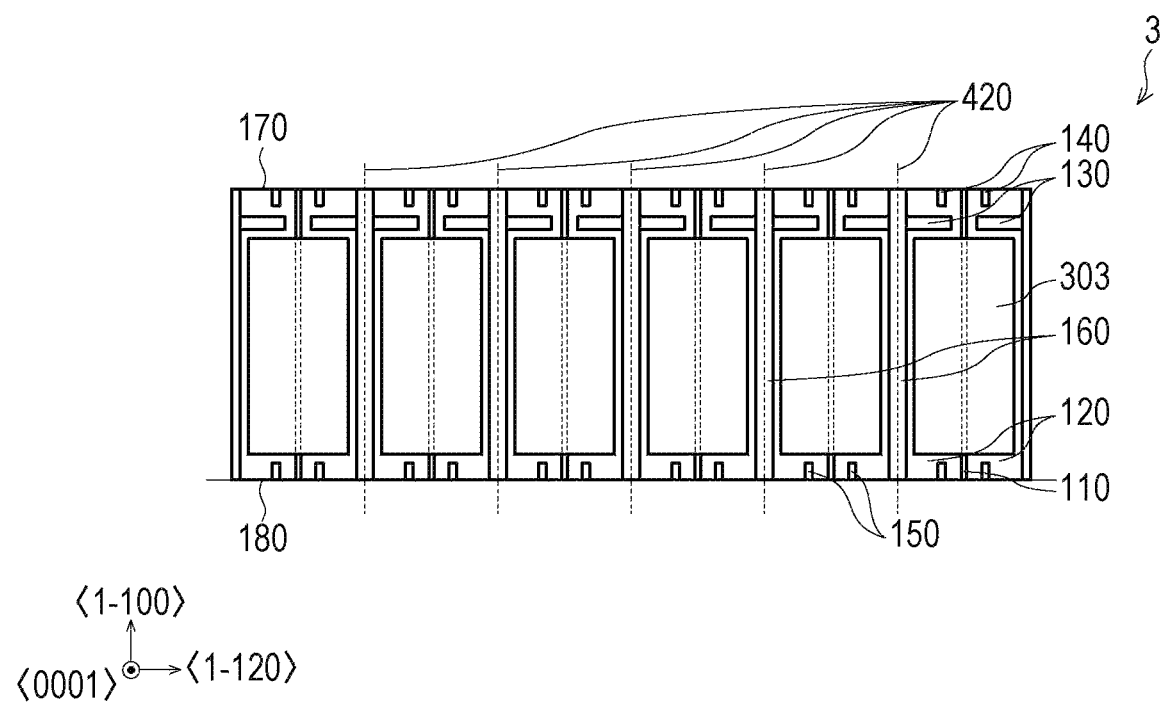
FIG. 14 is a plan view schematically illustrating a bar in the process of manufacturing the semiconductor laser according to Embodiment 1 of the present disclosure.

The bar 3 is manufactured by cleaving the wafer 2, and the end surface of the resonator is thus exposed. FIG. 14 is a plan view schematically illustrating the bar in the process of manufacturing the semiconductor laser according to Embodiment 1 of the present disclosure. In the bar 3, a plurality of semiconductor laser devices 1 are arranged side by side.

The formed end surface of the resonator corresponds to the {1-100} plane of the nitride semiconductor crystal. For example, the cleavage is performed by attaching a ruled line on a side of the wafer 2 in which the p-electrode 303 is formed with a scriber and applying a force to the wafer 2. Alternatively, it goes without saying that the cleavage is performed by attaching the ruled line to a part of the wafer 2, for example, only an edge part of the wafer 2 with a scriber and using the ruled line as a starting point.

(12) After two end surfaces of the resonator are formed, the dielectric film 302 made of $SiO_2$ and $TiO_2$ is alternately formed on both of the end surfaces of the resonator by vapor deposition, sputtering, and the like, and a dielectric multilayer reflective film is thus formed. One of the two formed end surfaces of the resonator is referred to as a light emitting surface 170 of laser light, and for example, an anti-reflective (AR) coating layer is formed to have a reflectivity of 5%. In addition, the other end surface of the resonator is referred to as a reflective surface 180, and for example, a highly reflective (HR) coating layer is formed to have a reflectivity of 95%. Note that, the reflective is not limited thereto. Alternatively, a material of the dielectric film is not limited to the $SiO_2$ and $TiO_2$, and examples of the material include oxides such as silicon, magnesium, aluminum, hafnium, niobium, zirconium, scandium, tantalum, gallium, zinc, yttrium, boron, and titanium, nitrides thereof, fluorides thereof, and oxynitrides thereof.

(13) The bar 3 is divided by a division line 420 in the division guide groove 160. Thereby, individual semiconductor laser devices 1 (chips) are obtained.

In this case, the ruled line is made on a surface on which the n-electrode 304 on the wafer 2 is formed at a position coinciding with the division guide groove 160 using the scriber. Then, a proper force is applied to the bar 3 and the bar 3 is divided along the ruled line, thereby manufacturing the semiconductor laser device 1 (chip).

Figure 15:
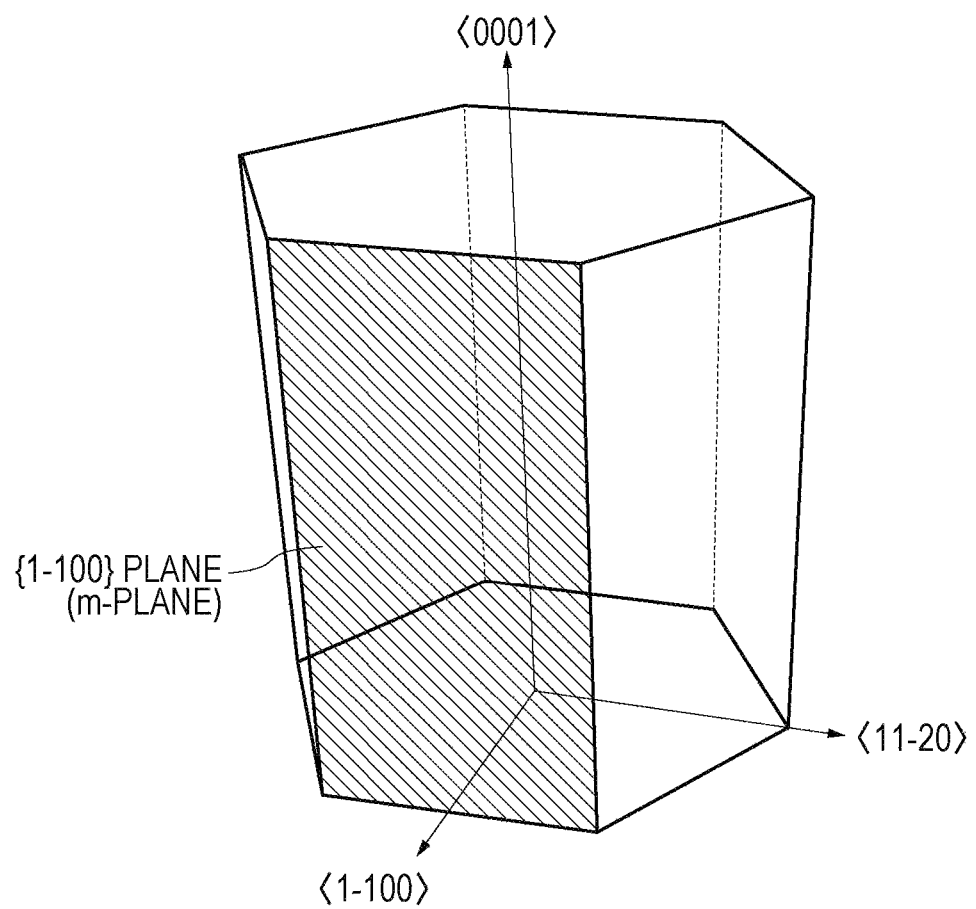
FIG. 15 is a schematic view illustrating a crystal orientation of gallium nitride having a hexagonal crystal structure.

Here, the nitride semiconductor crystal will be described below with reference to FIG. 15, as an example of a gallium nitride crystal. FIG. 15 is a schematic view illustrating a crystal orientation of gallium nitride having a hexagonal crystal structure. The hexagonal crystal structure can be represented by a regular hexagonal column. An upper plane of the regular hexagonal column is referred to as a {0001} plane (C-plane). In addition, a direction perpendicular to the {0001} plane is referred to as a <0001> direction. The {0001} plane corresponds to a plane on which the layer structure is laminated as exemplified in the present embodiment. When viewed from the above, the regular hexagonal column is six-times rotary symmetry with the same shape every time it is rotated by 60°. That is, in a case where the crystal structure is represented by the regular hexagonal column, all the side planes of the regular hexagonal column have the same properties and are referred to as a {1-100} plane (m-plane). The {1-100} plane has cleavability that bonding of molecules is easily cleaved in a perpendicular direction (<1-100> direction). Therefore, when the {1-100} plane is cleaved, a crystal plane having an excellent flatness is obtained. Because of this property, a pair of facing {1-100} planes are suitable as a surface of the resonator of the semiconductor laser device, and in order to set the <1-100> direction which is a direction perpendicular to the {1-100} plane as an optical waveguide direction, the ridge 110 is manufactured toward the same direction.

Effect

First, by injecting a current into the semiconductor layer 20 from the top of the ridge 110 by the p-electrode 303, holes and electrons are coupled again in the vicinity of the active layer below the ridge 110, and light is thus generated. The semiconductor layer 20 confines light inside the n-type clad layer 202 and the p-type clad layer 207 and guides the light in an X direction which is the optical waveguide direction. The light is reflected by a pair of optical resonators provided in a direction perpendicular to the X direction and promoted to be guided and emitted, and the light is thus amplified. Therefore, laser light is generated and emitted from the end surface on the side of the light emitting surface 170.

The width of the optical waveguide in the Y axis is narrowed by the second groove 130 and the third groove 140 which are provided on the side of the light emitting surface 170 extending in the X direction, and the emitted laser light is close to Gaussian distribution as the radiation angle $\theta_h$ of the FFP in the horizontal transverse mode is widened.

More specifically, the radiation angle $\theta_h$ in the horizontal transverse mode of laser light that is wave-guided from a portion between the second grooves 130 and 130 to the side of the light emitting surface 170, is widened between the second grooves 130 and 130. The shape of laser light in the horizontal transverse mode, that is widened by the second grooves 130 and 130, is narrowed between the third grooves 140 and 140 to the length L45 which is a distance longer than the L35. Accordingly, the radiation angle $\theta_h$ in the horizontal transverse mode is close to a Gaussian shape.

In the semiconductor laser device 1 according to the present embodiment, when viewed from a plan view, the two second grooves 130 and 130 and the two third grooves 140 and 140 are disposed symmetrically to the center axis of the ridge 110 along the X direction. Therefore, the optical waveguide is symmetrically narrowed in the X direction. Thus, the FFP of laser light from the light emitting surface 170 can be desirably close to Gaussian distribution.

In the semiconductor laser device 1 according to the present embodiment, the FFP having an aspect ratio ($\theta v/\theta h$) of 2.05 to 2.85, which is less than the conventional one, can be realized.

Since laser light can be suppressed from leaking from the side surface of the third groove 140 by covering the third groove 140 with the dielectric film 302, occurrence of ripples in the FFP can be suppressed.

In the manufacturing method described above, the cutting out (cleaving) of a semiconductor laser device region is performed so that the length L42 of the third groove 140 at one side as the light emitting surface 170 is to be a desired length. Accordingly, the third groove 140 having an expected length L42 in the semiconductor device 1 can be manufactured. Therefore, it is possible to improve yield in the cleavage.

As apparent from the above description, the semiconductor laser device of the present embodiment has an excellent FFP having a more circular shape and high reliability.

Embodiment 2

Hereinafter, another embodiment of the present disclosure will be described below. For convenience, members similar in function to those described in the above-described embodiment will be given the same reference signs, and their description will be omitted.

The present embodiment is different from Embodiment 1 in that in the present disclosure, the first recess is a groove-shaped recess formed along the ridge 110 and protrusions having the same height with the ridge 110 are formed on both sides of the ridge 110 and it is the substantially the same as Embodiment 1 in other points. In the present embodiment, the first groove 120 is a groove-shaped recess formed on both sides of the ridge 110 along the X direction laterally traversing the semiconductor laser device 1.

Figure 16:
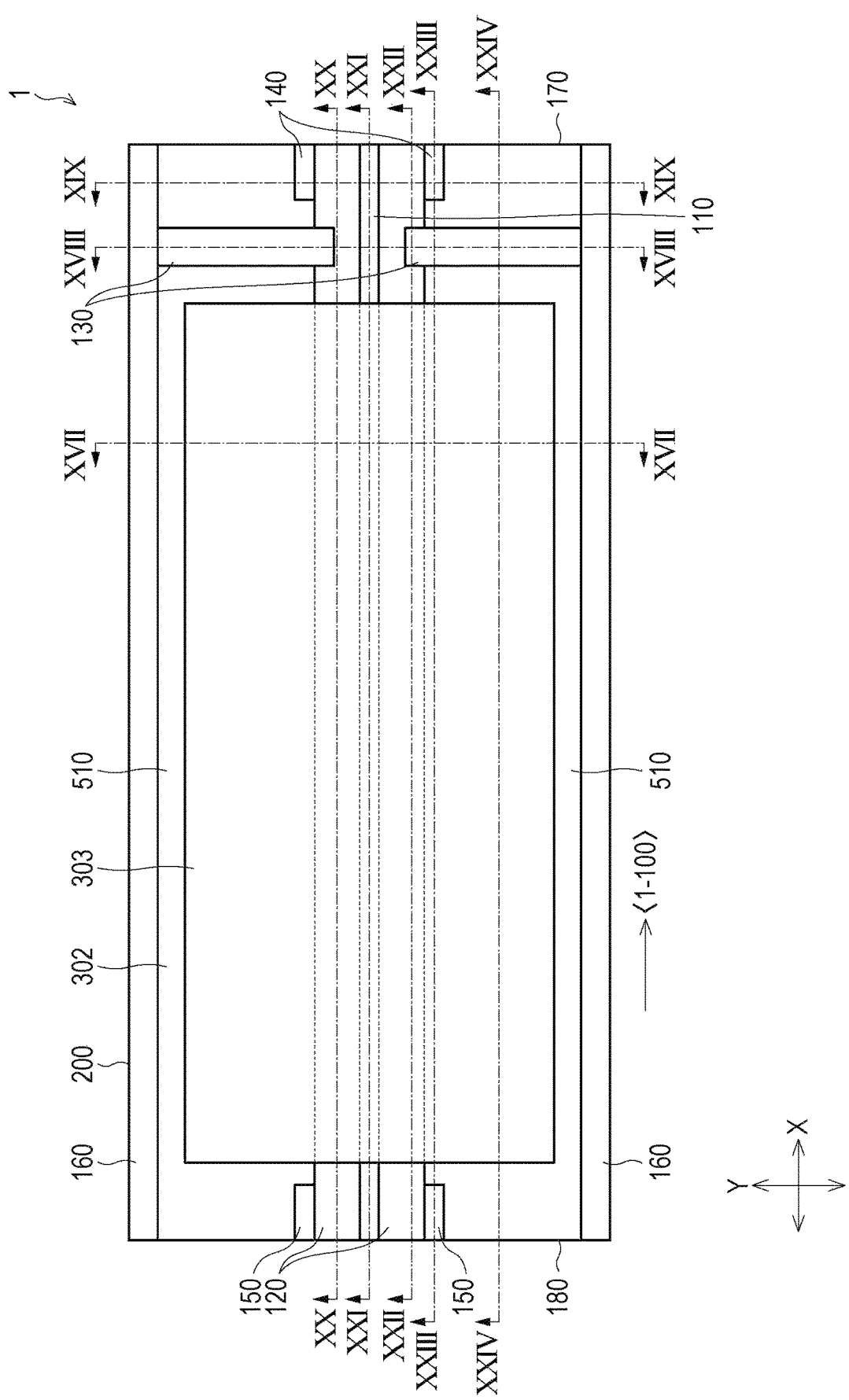
FIG. 16 is a plan view schematically illustrating a configuration of a semiconductor laser device according to Embodiment 2 of the present disclosure.
Figure 17:
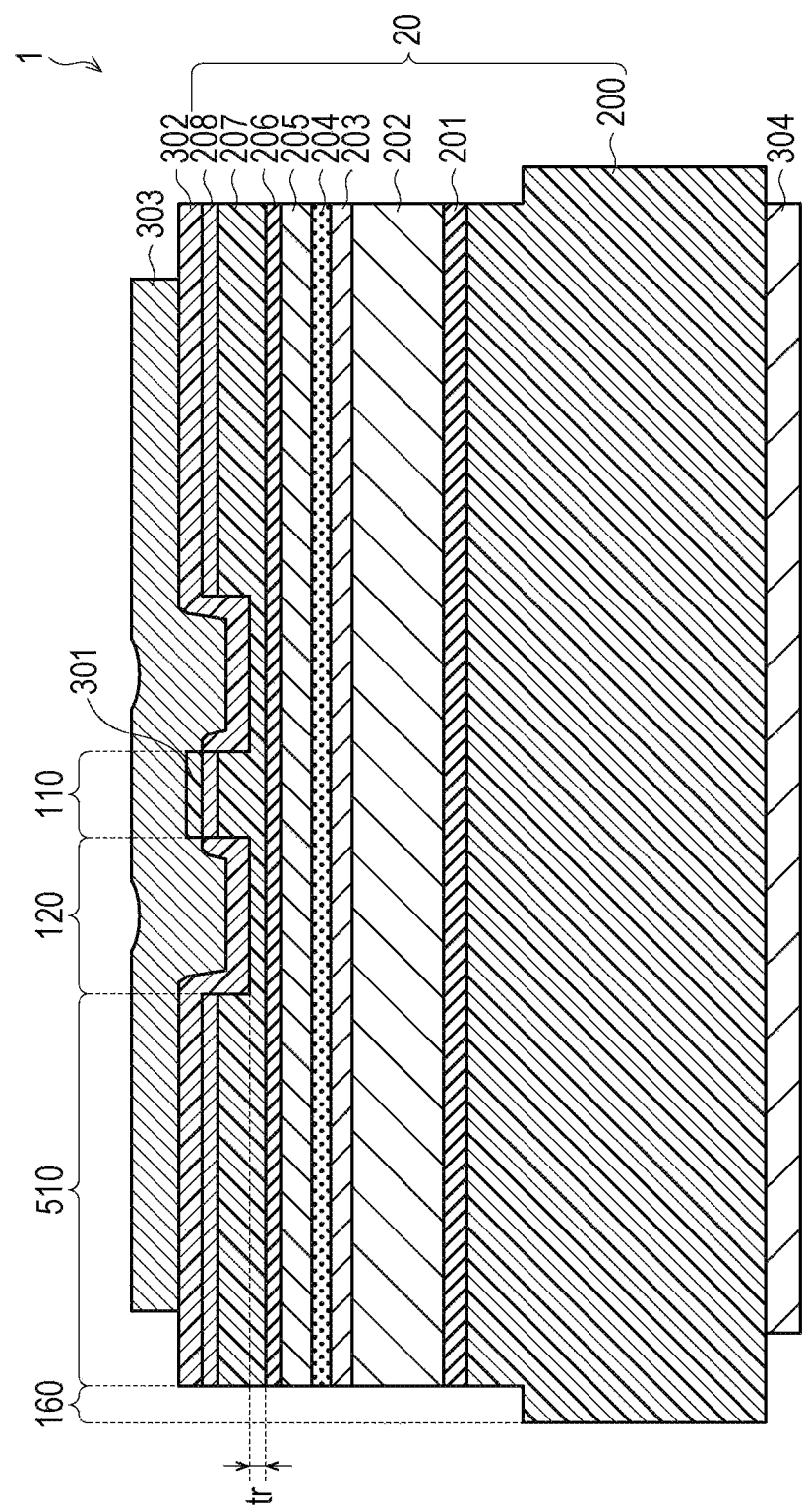
FIG. 17 is a view schematically illustrating a cross section of a semiconductor laser according to Embodiment 2 of the present disclosure, which is taken along the line XVII-XVII in FIG. 16.
Figure 18:
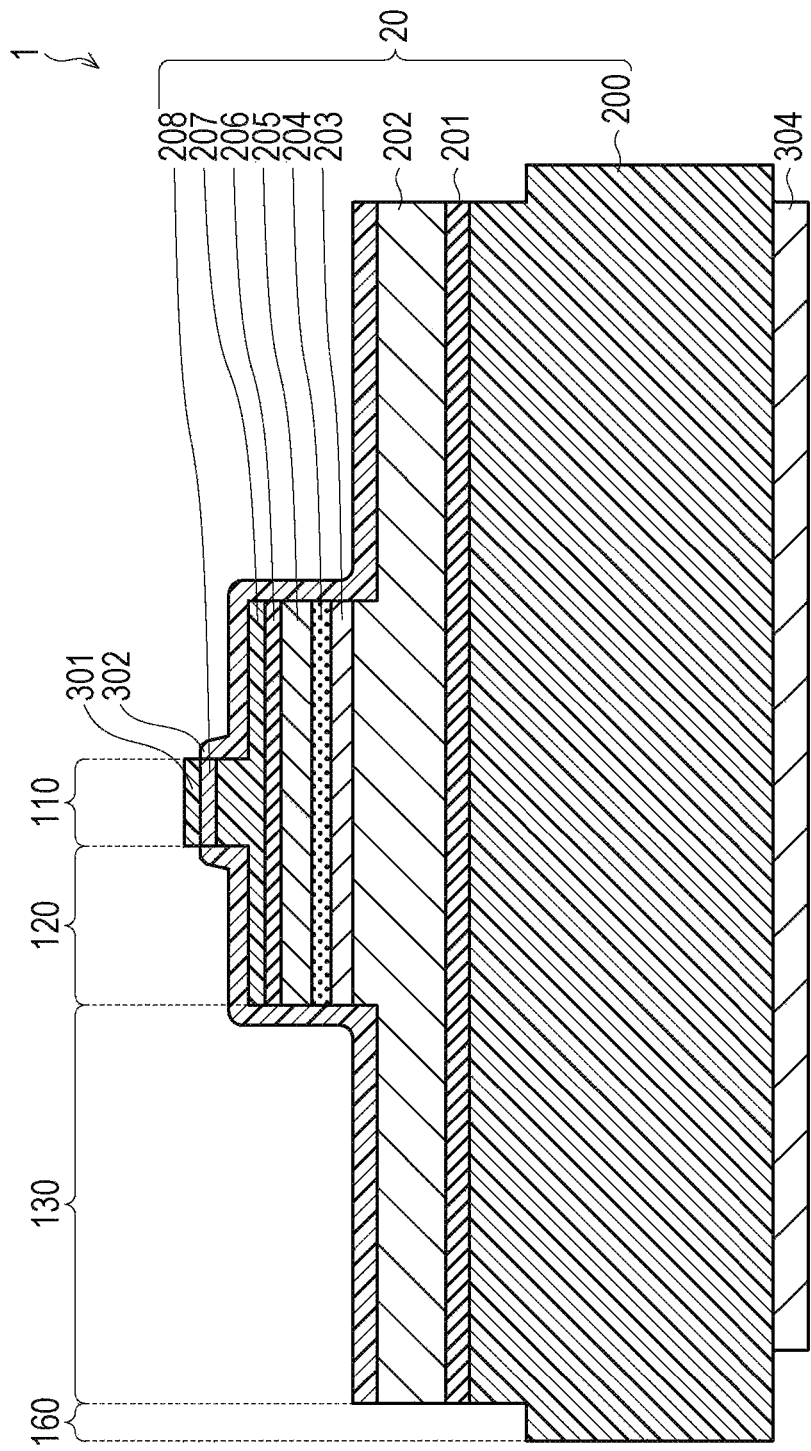
FIG. 18 is a view schematically illustrating a cross section of a semiconductor laser according to Embodiment 2 of the present disclosure, which is taken along the line XVIII-XVIII in FIG. 16.
Figure 19:
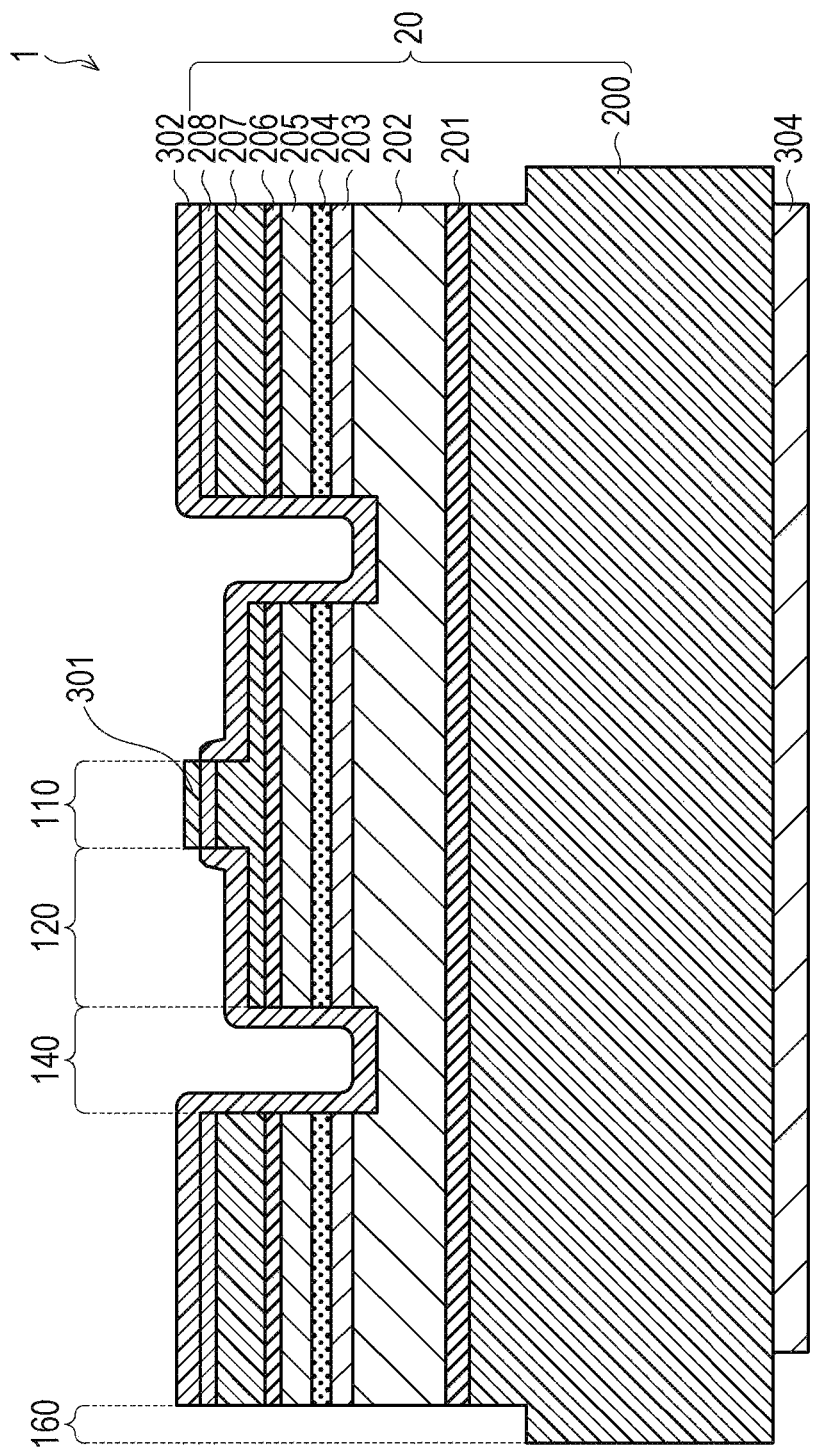
FIG. 19 is a view schematically illustrating a cross section of a semiconductor laser according to Embodiment 2 of the present disclosure, which is taken along the line XIX-XIX in FIG. 16.
Figure 20:
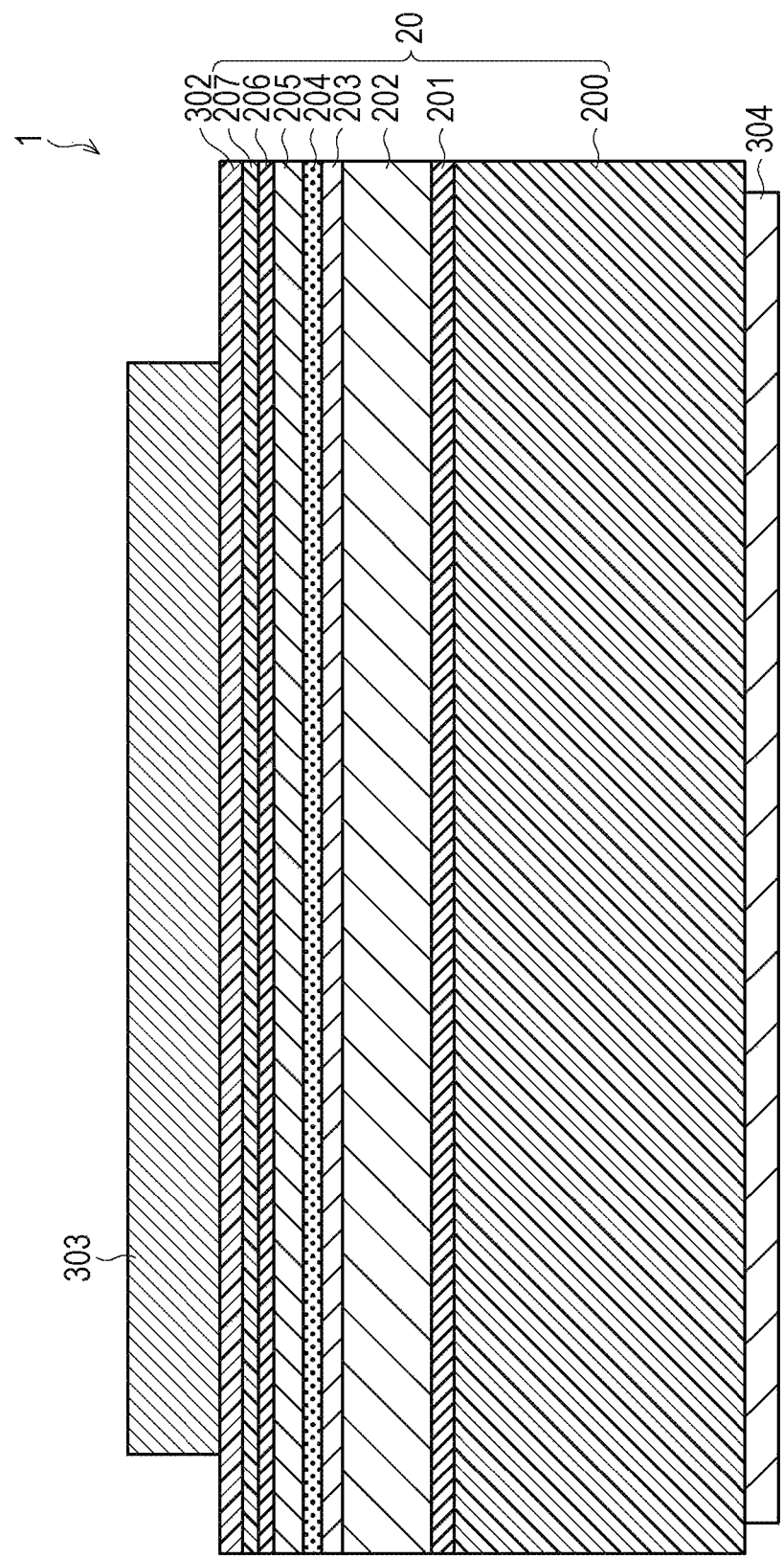
FIG. 20 is a view schematically illustrating a cross section of a semiconductor laser according to Embodiment 2 of the present disclosure, which is taken along the line XX-XX in FIG. 16.
Figure 21:
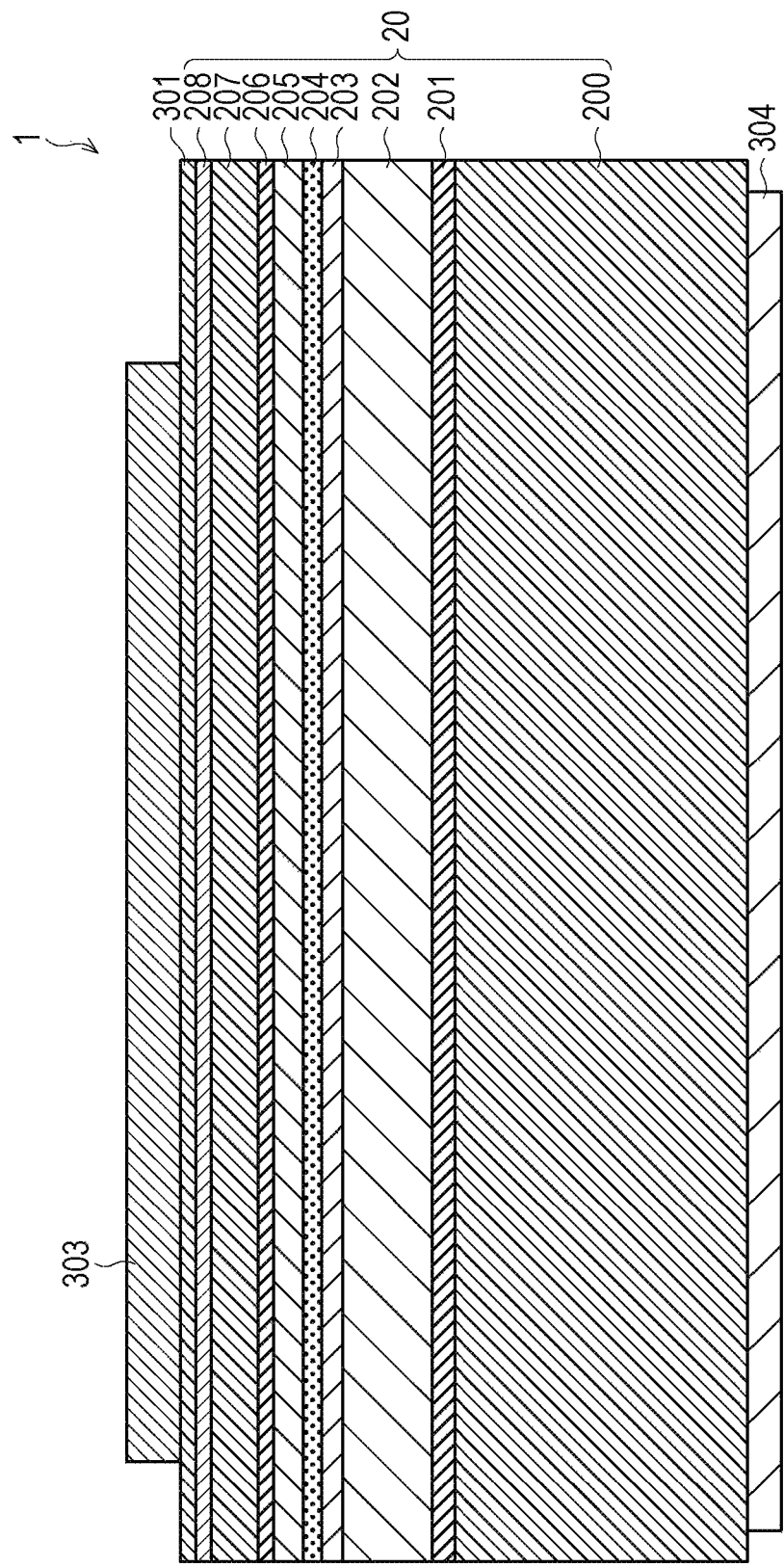
FIG. 21 is a view schematically illustrating a cross section of a semiconductor laser according to Embodiment 2 of the present disclosure, which is taken along the line XXI-XXI in FIG. 16.
Figure 22:
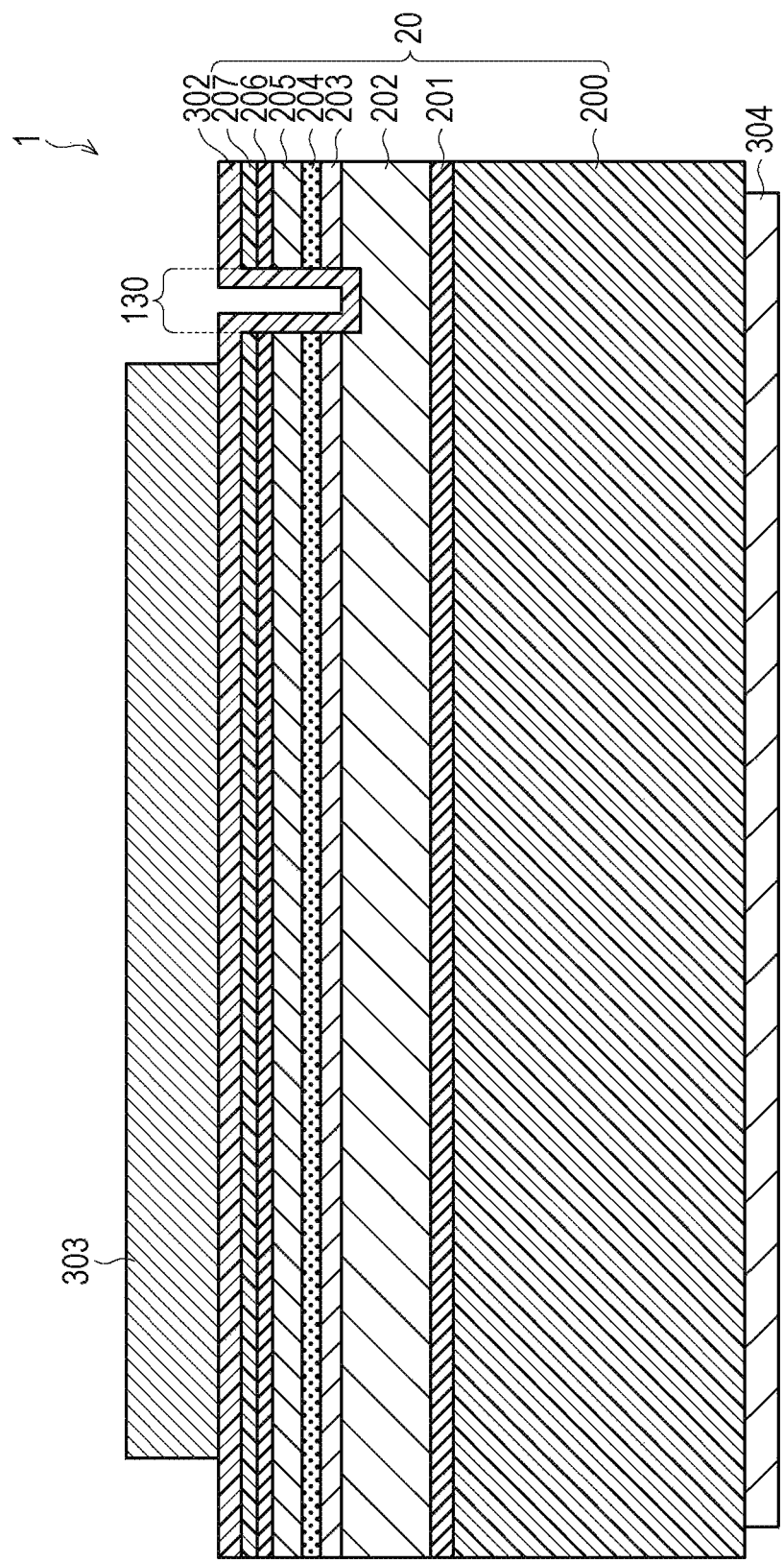
FIG. 22 is a view schematically illustrating a cross section of a semiconductor laser according to Embodiment 2 of the present disclosure, which is taken along the line XXII-XXII in FIG. 16.
Figure 23:
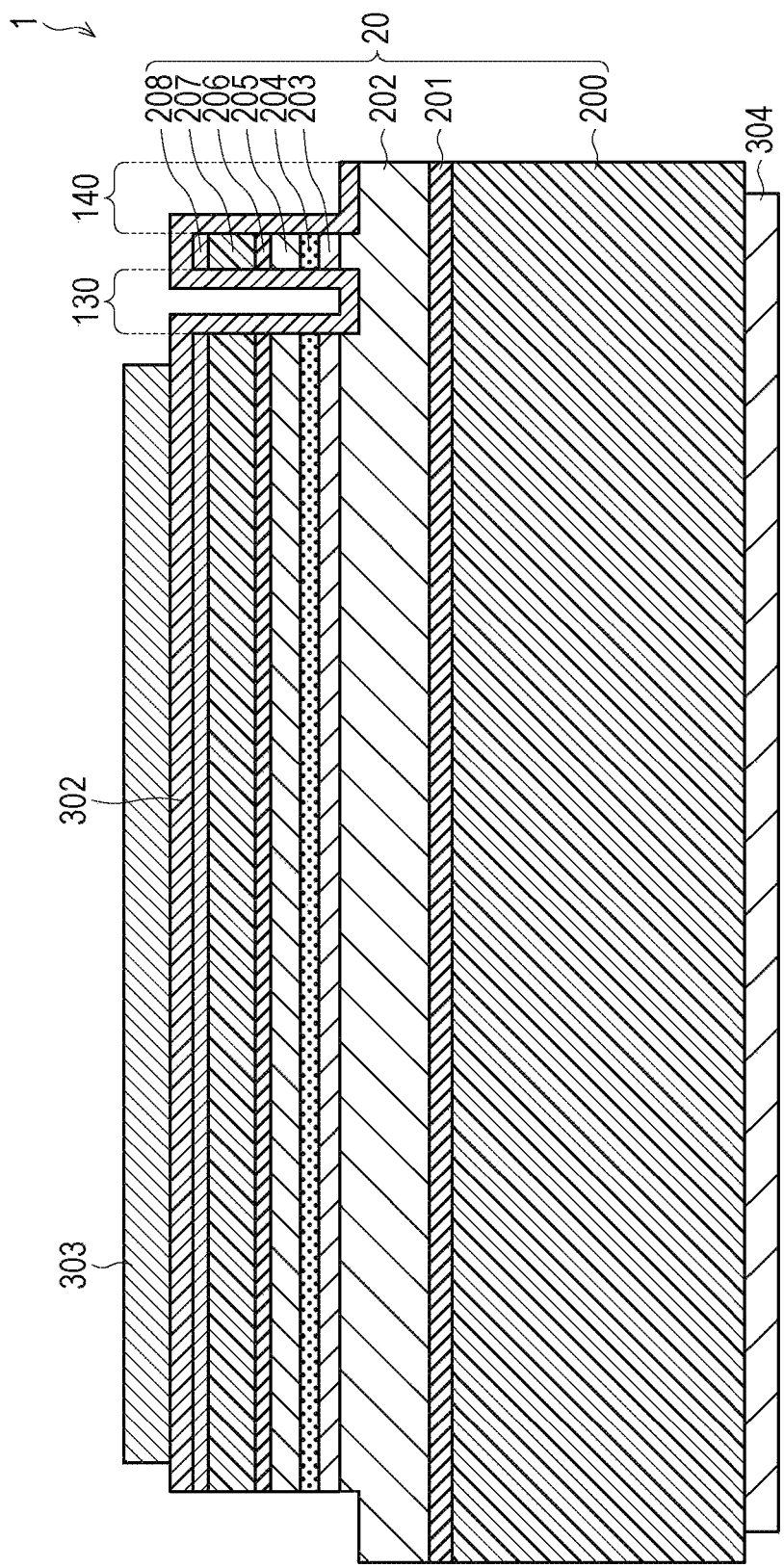
FIG. 23 is a view schematically illustrating a cross section of a semiconductor laser according to Embodiment 2 of the present disclosure, which is taken along the line XXIII-XXIII in FIG. 16.
Figure 24:
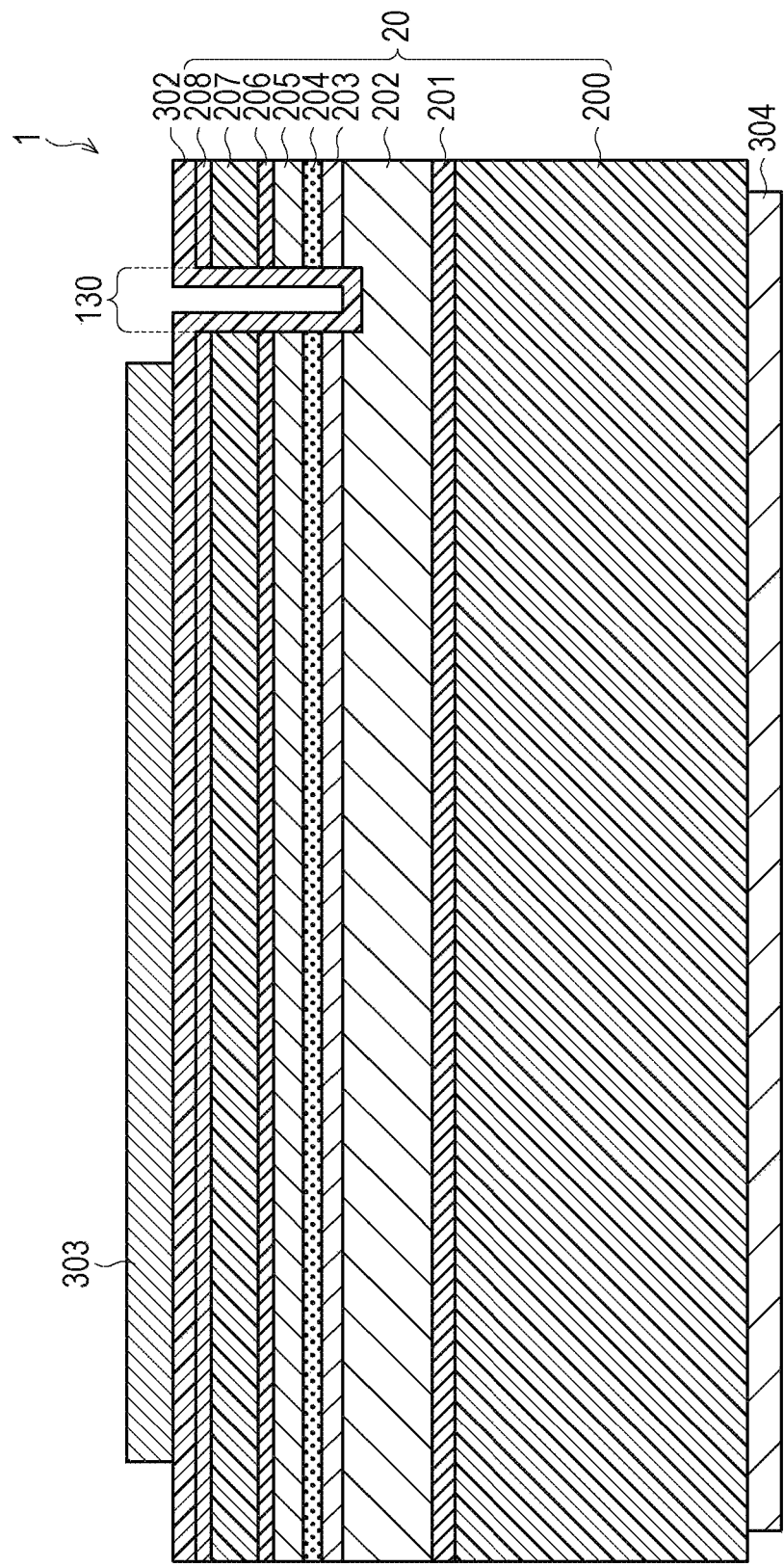
FIG. 24 is a view schematically illustrating a cross section of a semiconductor laser according to Embodiment 2 of the present disclosure, which is taken along the line XXIV-XXIV in FIG. 16.

The semiconductor laser device according to the present embodiment will be described with reference to FIGS. 16 to 24. FIG. 16 is a plan view schematically illustrating a configuration of the semiconductor laser device according to Embodiment 2 of the present disclosure. FIGS. 17 to 24 are views schematically illustrating cross sections of the semiconductor laser, which are taken along the lines XVII-XVII, XVIII-XVIII, XIX-XIX, XX-XX, XXI-XXI, XXII-XXII, XXIII-XXIII, and XXIV-XXIV in FIG. 16, respectively.

As illustrated in FIG. 16, the first grooves 120 and 120 are two grooves which extend, in parallel, from one end to the other end in the X direction laterally traversing the semiconductor layer 20 when viewed in a plan view. The ridge 110 is formed between the first grooves 120 and 120 and is a portion protruding from the first groove 120. The second grooves 130 and 130 are two grooves which extend from an end to each of the first grooves 120 and 120 in the Y direction longitudinally traversing the semiconductor layer 20 when viewed in a plan view.

Dummy ridges 510 and 510 are disposed outside the first grooves 120 and 120. A height of the dummy ridge 510 from the bottom surface of the first groove 120 is substantially the same as that of the ridge 110. The dummy ridges 510 and 510 are formed over the entire length of the semiconductor laser device in the X direction and formed between the first groove 120 and the division guide groove 160 in the Y direction.

As described above, a structure including the two first grooves 120 and 120 on both sides of the ridge 110 and the dummy ridges 510 and 510 which are two protruding stripes on the outer side of the two first grooves 120 and 120, is particularly referred to as a "double-channel ridge structure".

Shapes of the first groove 120, the second groove 130, and the third groove 140 can be appropriately determined in a range in which an expected function is exhibited as in Embodiment 1.

Figure 25:
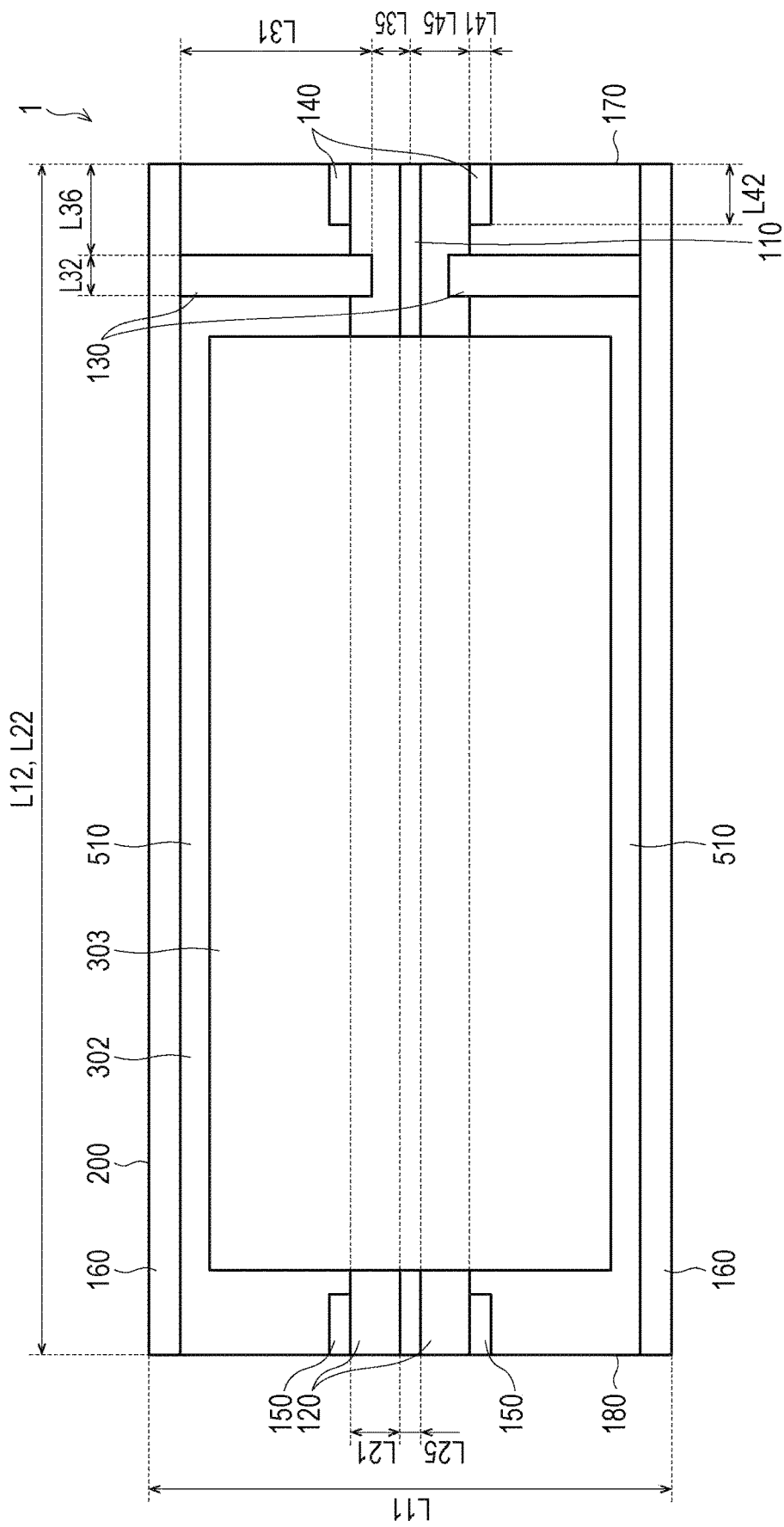
FIG. 25 is a view for explaining dimensions of the semiconductor laser according to Embodiment 2 of the present disclosure.

Hereinafter, dimensions and disposition of the first groove 120 will be described. FIG. 25 is a view for explaining dimensions of the semiconductor laser according to Embodiment 2 of the present disclosure. Here, as in Embodiment 1, dimensions and the like in each component of the semiconductor laser device 1 will be described assuming that a resonator has a length of 800 μm and a chip width of 200 μm.

The first groove 120 has the length L22 in the X direction, the length L21 in the Y direction, and a length (depth) in the laminating direction. As illustrated in FIG. 25, in Embodiment 2, the length L21 of the first groove 120 in the Y direction reaches the end portion of the third groove 140 on the side of the ridge 110.

The length L21 of the first groove 120 in the Y direction is likely to confine light to the optical waveguide and can be appropriately determined from a range of 15 μm or more and 50 μm or less from the viewpoint of bringing a far field pattern (hereinafter, referred to as "FFP") closer to Gaussian distribution. For example, the length L21 may be 15 μm. When the length L21 is less than 15 μm, an effect of confining light in a perpendicular direction in the ridge 110 may be insufficient. From the viewpoint of obtaining the effect of confining light in the same manner as that of the semiconductor laser device in Embodiment 1, it is desirable that the length L21 is 15 μm or more.

In the present embodiment, the end portion of each of the second grooves 130 and 130 on the side of the ridge 110 reaches the outer surface of the first groove 120 or the side of the ridge 110 from the side surface. Accordingly, stay light leaked out from the optical waveguide is further suppressed from propagating through the semiconductor layer 20 and leaking out from the light emitting surface. Therefore, it is desirable from the viewpoint of bringing the FFP of laser light closer to Gaussian distribution.

In the present embodiment, in addition to the effect in Embodiment 1, the following effect is achieved. In a case where the semiconductor laser device in the present embodiment is mounted on the sub-mount by the junction down method, not only the ridge 110 but also the dummy ridge 510 brings into contact with the sub-mount. Thus, a force applied to the ridge 110 at the time of the mounting is distributed to the dummy ridge 510. Thus, it is possible to bond the ridge 110 on the sub-mount so as not to be distorted on the ridge 110 at the time of the mounting. As such, according to the present embodiment, it is possible to protect the ridge 110 from damage at the time of the mounting. The present embodiment is more effective from the viewpoint of enhancing the reliability of the semiconductor laser device.

The present disclosure contains subject matter related to that disclosed in U.S. Provisional Patent Application No. 62/801,505 filed in the US Patent Office on Feb. 5, 2019, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor laser device in which a semiconductor layer, a dielectric film, and an electrode layer are stacked in this order,
    wherein the semiconductor layer is formed by stacking an n-type clad layer and a p-type clad layer in this order, and includes
        a ridge formed on the p-type clad layer and extending from one end to an other end in a direction laterally traversing the semiconductor layer, when viewed in a plan view,
        two first recesses, each of which is formed on both sides of the ridge along the laterally traversing direction,
        two groove-shaped second recesses having a depth reaching the n-type clad layer from the p-type clad layer and extending from each end in a direction longitudinally traversing the semiconductor layer to positions where the ridge is interposed between the two groove-shaped second recesses, when viewed in a plan view, and
        two groove-shaped third recesses having a depth reaching the n-type clad layer from the p-type clad layer, extending from the one end in the direction laterally traversing the semiconductor layer toward the second recesses in the laterally traversing direction when viewed in a plan view, and disposed at positions where the ridge is interposed between the two groove-shaped third recesses in the longitudinally traversing direction,
    the dielectric film covers at least a surface of the semiconductor layer other than the ridge, and
    the electrode layer overlaps the ridge and overlaps the dielectric film on an other end side from the second recesses in the laterally traversing direction when viewed in a plan view.

2. The semiconductor laser device according to claim 1, wherein the first recesses are groove-shaped recesses, each of which is formed on both sides of the ridge along the laterally traversing direction.

3. The semiconductor laser device according to claim 1, wherein one end surface in the laterally traversing direction is a light emitting surface and an other end surface is a reflective surface.

4. The semiconductor laser device according to claim 1, wherein the electrode layer includes a first electrode layer overlapping the ridge, and a second electrode layer overlapping the dielectric film and the first electrode layer on the other end side from the second recesses in the laterally traversing direction when viewed in a plan view.

5. The semiconductor laser device according to claim 1, wherein the second recesses are disposed at positions symmetric with respect to the ridge in the longitudinally traversing direction.

6. The semiconductor laser device according to claim 1, wherein the third recesses are connected to the second recesses on other ends in the laterally traversing direction.

7. The semiconductor laser device according to claim 1, wherein the dielectric film further covers at least side surface portions of the second recesses in the longitudinally traversing direction.

* * * * *